(12) United States Patent
Kim et al.

(10) Patent No.: US 12,713,155 B2
(45) Date of Patent: Aug. 18, 2026

(54) IMAGE SENSOR

(71) Applicant: SAMSUNG ELECTRONICS CO., LTD., Suwon-si (KR)

(72) Inventors: Yunhong Kim, Suwon-si (KR); Mooyoung Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 110 days.

(21) Appl. No.: 18/443,417

(22) Filed: Feb. 16, 2024

(65) Prior Publication Data

US 2025/0024168 A1 Jan. 16, 2025

(30) Foreign Application Priority Data

Jul. 13, 2023 (KR) ........................ 10-2023-0091245

(51) Int. Cl.

*H04N 25/77* (2023.01)
*H04N 25/533* (2023.01)
*H04N 25/58* (2023.01)
*H04N 25/583* (2023.01)
*H04N 25/70* (2023.01)

(Continued)

(52) U.S. Cl.

CPC ........... *H04N 25/77* (2023.01); *H04N 25/533* (2023.01); *H04N 25/58* (2023.01); *H04N 25/583* (2023.01); *H04N 25/70* (2023.01); *H04N 25/78* (2023.01); *H10F 39/8037* (2025.01)

(58) Field of Classification Search

CPC .... H04N 25/533; H04N 25/58; H04N 25/583; H04N 25/70; H04N 25/77; H04N 25/78; H10F 39/8037

See application file for complete search history.

(56) References Cited

U.S. PATENT DOCUMENTS 8,345,136 B2 * 1/2013 Song ...................... H04N 25/77 348/308
9,741,754 B2 * 8/2017 Li ......................... H10F 39/803

(Continued)

FOREIGN PATENT DOCUMENTS

KR 10-2021-0054092 A 5/2021
KR 10-2023-0015161 A 1/2023

(Continued)

*Primary Examiner* — Lin Ye
*Assistant Examiner* — Chriss S Yoder, III
(74) *Attorney, Agent, or Firm* — Morgan, Lewis & Bockius LLP

(57) ABSTRACT

An image sensor including: a pixel array including pixels; and a logic circuit including a row decoder to drive selected pixels, a column decoder to vary exposure time periods for a portion of the selected pixels, and a readout circuit to obtain pixel signals from the selected pixels, wherein each of the pixels includes a photodiode, a first transfer transistor connected between the photodiode and a first floating diffusion region, a second transfer transistor connected between the first floating diffusion region and a second floating diffusion region, a first reset transistor and a switch transistor connected to each other in series between a power node and the first floating diffusion region, a second reset transistor connected between the power node and the second floating diffusion region, a source-follower transistor connected to the second floating diffusion region, and a select transistor connected to the source-follower transistor.

14 Claims, 20 Drawing Sheets

(51) Int. Cl.
*H04N 25/78* (2023.01)
*H10F 39/00* (2025.01)

(56) References Cited

U.S. PATENT DOCUMENTS

| | | | | |
|---|---|---|---|---|
| 11,722,794 | B2 * | 8/2023 | Innocent | H04N 25/57 348/302 |
| 2012/0274822 | A1 | 11/2012 | Smith et al. | |
| 2018/0070031 | A1 * | 3/2018 | Velichko | H04N 25/589 |
| 2019/0075261 | A1 | 3/2019 | Machida et al. | |
| 2021/0136303 | A1 | 5/2021 | Kim et al. | |
| 2023/0021729 | A1 | 1/2023 | Yahata | |
| 2023/0124606 | A1 | 4/2023 | Yahata et al. | |

FOREIGN PATENT DOCUMENTS

| | | | |
|---|---|---|---|
| KR | 10-1473597 | B1 | 1/2023 |
| KR | 10-2023-0024566 | A | 2/2023 |
| KR | 10-2023-0055626 | A | 4/2023 |
| WO | WO2012031026 | A2 | 3/2012 |

* cited by examiner

IMAGE SENSOR

CROSS-REFERENCE TO RELATED APPLICATION(S)

This application claims priority under 35 U.S.C. § 119 to Korean Patent Application No. 10-2023-0091245 filed on Jul. 13, 2023 in the Korean Intellectual Property Office, the disclosure of which is incorporated by reference herein in its entirety.

TECHNICAL FIELD

Example embodiments of the present disclosure relate to an image sensor.

DISCUSSION OF RELATED ART

A semiconductor-based image sensor receives light and converts it into an electrical signal. The image sensor may include a pixel array with numerous pixels and a logic circuit that operates the pixel array to produce an image. Each of the pixels may include a photodiode and a pixel circuit for converting an electrical charge generated by the photodiode into an electrical signal. To enhance the dynamic range of an image generated by an image sensor, a technique involving the combination of two or more images obtained at different exposure time periods has been proposed. However, this approach can reduce the image sensor's frame rate, potentially leading to issues.

SUMMARY

An example embodiment of the present disclosure provides an image sensor which may generate an image having a relatively high dynamic range in a single frame.

According to an example embodiment of the present disclosure, there is provided an image sensor including: a pixel array including a plurality of pixels arranged in a first direction and a second direction intersecting the first direction; and a logic circuit including a row decoder configured to drive selected pixels disposed in the same position in the second direction among the plurality of pixels, a column decoder configured to vary exposure time periods for a portion of the selected pixels, and a readout circuit configured to obtain pixel signals from the selected pixels, wherein each of the plurality of pixels includes at least one photodiode, a first transfer transistor connected between the photodiode and a first floating diffusion region, a second transfer transistor connected between the first floating diffusion region and a second floating diffusion region, a first reset transistor and a switch transistor connected to each other in series between a power node configured to supply a power voltage and the first floating diffusion region, a second reset transistor connected between the power node and the second floating diffusion region, a source-follower transistor connected to the second floating diffusion region, and a select transistor connected to the source-follower transistor.

According to an example embodiment of the present disclosure, there is provided an image sensor including: a pixel array including a plurality of pixels arranged in a first direction and a second direction intersecting the first direction; and a logic circuit including a row decoder connected to the plurality of pixels by a plurality of row control lines extending in the first direction, and a column decoder connected to the plurality of pixels by a plurality of column control lines extending in the second direction, wherein each of the plurality of pixels includes at least one photodiode formed in a substrate and separated by a pixel separation film, and a plurality of active regions and a plurality of gates overlapping the photodiode, wherein at least one gate of the plurality of gates is connected to the column decoder through one of the plurality of column control lines, and wherein the other gates of the plurality of gates are connected to the row decoder through of the plurality of row control lines.

According to an example embodiment of the present disclosure, there is provided an image sensor including: a pixel array that includes a plurality of pixels; and a logic circuit configured to control the pixel array, wherein each of the plurality of pixels includes at least one photodiode, a first transfer transistor directly connected to the photodiode, a second transfer transistor connected to the first transfer transistor, a switch transistor connected to a node between the first transfer transistor and the second transfer transistor, a first reset transistor connected between a power node configured to supply a power voltage and the switch transistor, a source-follower transistor having a gate connected to the second transfer transistor, a second reset transistor connected between the gate of the source-follower transistor and the power node, and a select transistor connected between the source-follower transistor and an output line, and wherein, in a read operation for each of the plurality of pixels, the logic circuit turns on the first reset transistor and the first transfer transistor in two or more reset time periods, and obtains a pixel signal in a readout time period in which the first transfer transistor and the second transfer transistor are turned on.

BRIEF DESCRIPTION OF THE DRAWINGS

The above and other features of the present disclosure will be more clearly understood from the following detailed description, taken in combination with the accompanying drawings, in which:

FIG. 19 is a diagram illustrating a pixel array of an image sensor according to an example embodiment of the present disclosure;

DETAILED DESCRIPTION OF THE EMBODIMENTS

Hereinafter, example embodiments of the present disclosure will be described with reference to the accompanying drawings.

Figure 1:
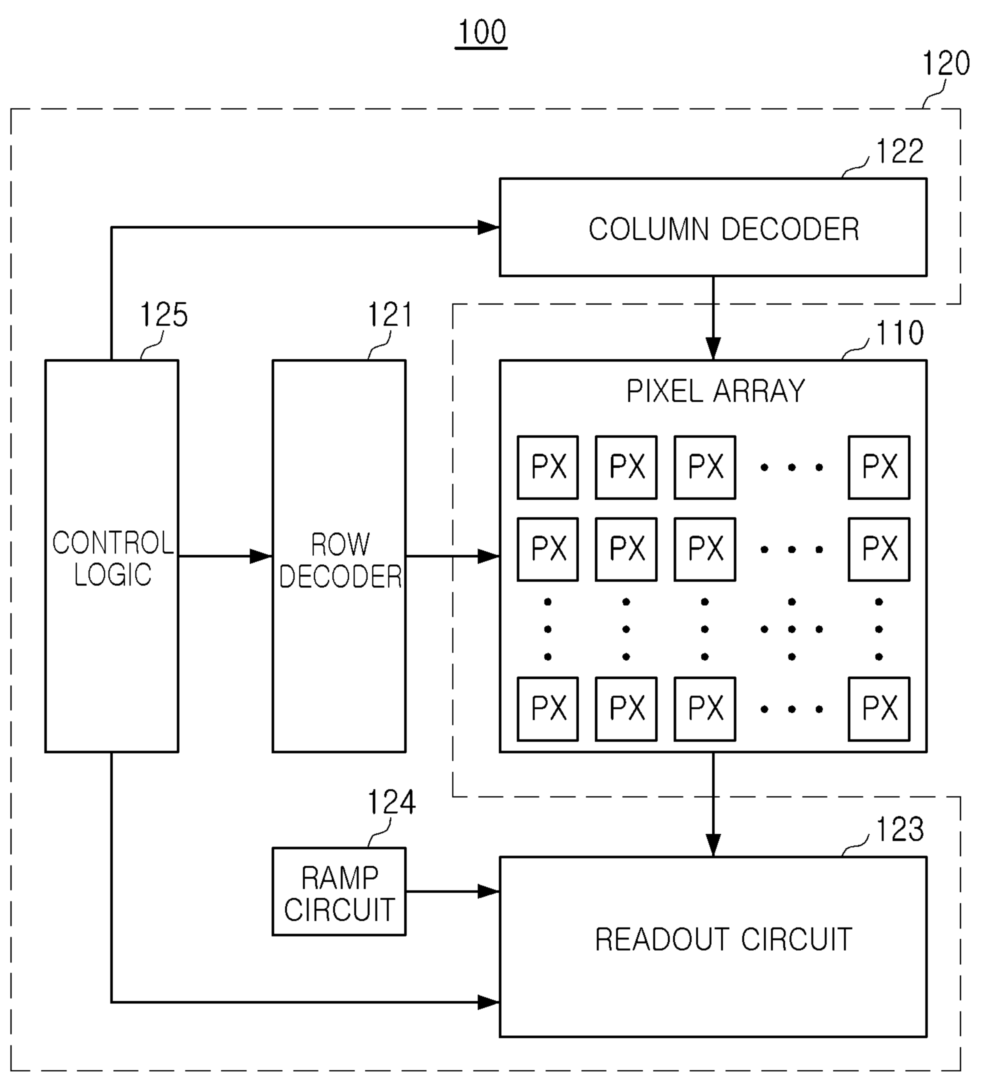
FIG. 1 is a block diagram illustrating an image sensor according to an example embodiment of the present disclosure.

FIG. 1 is a block diagram illustrating an image sensor according to an example embodiment of the present disclosure.

Referring to FIG. 1, an image sensor 100 may include a pixel array 110 and a logic circuit 120. The pixel array 110 may include a plurality of pixels PX arranged in an array. For example, the pixels PX may be arranged in a plurality of rows and a plurality of columns. Each of the plurality of pixels PX may include at least one photoelectric conversion element configured to generate electric charges in response to light, and a pixel circuit configured to generate a voltage signal corresponding to the electric charges generated by the photoelectric conversion element. The photoelectric conversion element may include a photodiode formed of a semiconductor material and/or an organic material. The photodiode formed of an organic material may be referred to as an organic photodiode.

For example, a pixel circuit may include a plurality of devices, and a configuration of the pixel circuit in each of the plurality of pixels PX may vary in example embodiments. For example, each of the plurality of pixels PX may include an organic photodiode including an organic material or may be a digital pixel. As for the digital pixel, each of a plurality of pixels PX may include an analog-to-digital converter for outputting a digital pixel signal.

The logic circuit 120 may include circuits for controlling the pixel array 110. For example, the logic circuit 120 may include a row decoder 121, a column decoder 122, a readout circuit 123, a ramp circuit 124, and a control logic 125. The row decoder 121 may be connected to the plurality of pixels PX via a plurality of row control lines extending in a first direction. The column decoder 122 may be connected to the plurality of pixels PX via a plurality of column control lines extending in a second direction different from the first direction. The readout circuit 123 may be connected to the plurality of pixels PX via a plurality of output lines extending in the second direction. In an example embodiment illustrated in FIG. 1, the first direction may be a horizontal direction, and the second direction may be a vertical direction.

The row decoder 121 may drive the pixel array 110 in units of row lines. In other words, two or more selected pixels disposed in the same position in the second direction and arranged in the first direction may be simultaneously driven by the row decoder 121. For example, the row decoder 121 may input control signals for controlling a transfer transistor, a reset transistor, and a select transistor included in a pixel circuit to the pixel array 110 in units of row lines.

In an example embodiment, an exposure time period of at least a portion of selected pixels determined by the row decoder 121 in units of row lines may be differently controlled by the column decoder 122. The column decoder 122 may configure end points of a reset time period differently for at least a portion of the selected pixels. For example, the column decoder 122 may configure an end point of the reset time period of a first pixel among the selected pixels to be earlier than an end point of the reset time period of a second pixel among the selected pixels. In this case, the exposure time period of the first pixel may be longer than the exposure time period of the second pixel. Accordingly, in an example embodiment, the exposure time period of each selected pixel may be individually configured by the column decoder 122 while the row decoder 121 drives the selected pixels determined in row line units.

The readout circuit 123 may include a plurality of unit circuits, and each of the plurality of unit circuits may include a sampler and an analog-to-digital converter. The plurality of unit circuits may be connected to the plurality of pixels PX through a plurality of output lines. For example, two or more pixels PX disposed in the same position in the first direction and arranged in the second direction may be connected to one of the plurality of unit circuits through one of the output lines.

The sampler may read a voltage signal through the output line from one of selected pixels arranged along a selected row line determined by row control signals output by the row decoder 121. One of the input terminals of the sampler may be connected to the output line, and the other input terminal of the sampler may be connected to the ramp circuit 114 and may receive a ramp voltage. Accordingly, the voltage signal output by the selected pixels determined by the row decoder 121 may be simultaneously received by the plurality of unit circuits and may be compared with the ramp voltage.

For example, the sampler may sequentially receive a reset voltage and a pixel voltage through an output line, and the pixel voltage may be obtained by reflecting electric charges generated by a photodiode of each pixel in the reset voltage. An output of the sampler may be determined according to a result of a comparison between the reset voltage and the ramp voltage, and a result of a comparison between the pixel voltage and the ramp voltage.

The analog-to-digital converter may convert an output of the sampler into a digital pixel signal. For example, a latch or a buffer circuit, which may temporarily store a digital pixel signal, and an amplification circuit may be connected to an output terminal of the analog-to-digital converter. The control logic 125 may include a timing controller for controlling operation timings of the row decoder 121, the column decoder 122, and the readout circuit 123. Each component of the logic circuit 120, e.g., the row decoder 121, the column decoder 122, the readout circuit 123, the ramp circuit 124 and the timing controller may be implemented in hardware as a circuit.

Figure 2:
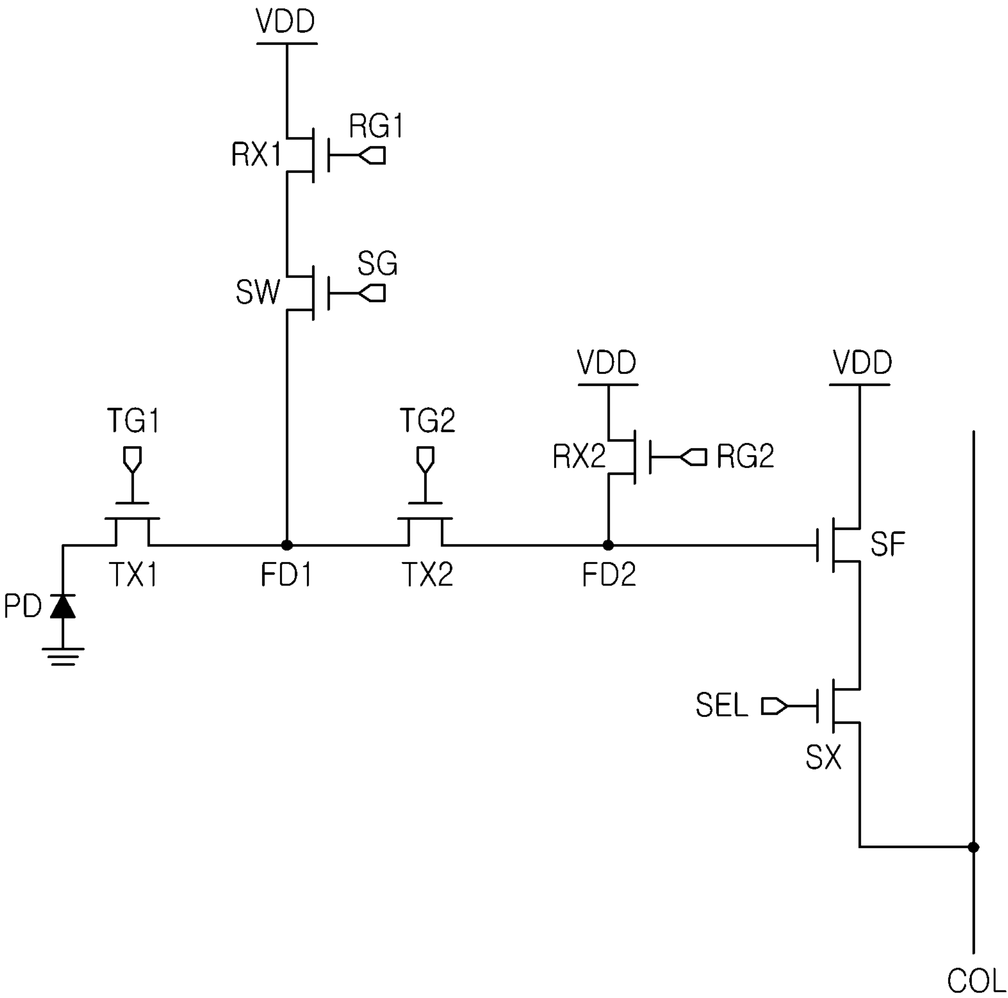
FIG. 2 is a circuit diagram illustrating pixels included in an image sensor according to an example embodiment of the present disclosure.

FIG. 2 is a circuit diagram illustrating pixels included in an image sensor according to an example embodiment of the present disclosure.

Referring to FIG. 2, a pixel of an image sensor according to an example embodiment may include a photodiode PD, and a pixel circuit for outputting a voltage signal corresponding to electric charges generated by the photodiode PD. The pixel circuit may be connected between the photodiode PD and an output line COL.

The pixel circuit may include a first transfer transistor TX1, a second transfer transistor TX2, a first reset transistor RX1, a second reset transistor RX2, a switch transistor SW, a source-follower transistor SF, and a select transistor SX. The first transfer transistor TX1 may be connected between the photodiode PD and a first floating diffusion region FD1, and the second transfer transistor TX2 may be connected between the first floating diffusion region FD1 and a second floating diffusion region FD2.

The first reset transistor RX1 and the switch transistor SW may be connected to each other in series between a power node for supplying a power voltage VDD and the first floating diffusion region FD1. For example, as illustrated in FIG. 2, the first reset transistor RX1 may be connected to the power node, and the switch transistor SW may be connected between the first reset transistor RX1 and the first floating diffusion region FD1.

The second reset transistor RX2 may be connected between the second floating diffusion region FD2 and the power node. A gate of the source-follower transistor SF may be connected to the second floating diffusion region FD2, and a source of the source-follower transistor SF may be connected to the power node. The select transistor SX may be connected between the source-follower transistor SF and the output line COL.

Each gate of a device of a pixel circuit may be connected to a row decoder through a row control line or may be connected to a column decoder through a column control line. For example, each gate of the first transfer transistor TX1, the second transfer transistor TX2, the first reset transistor RX1, the second reset transistor RX2, and the select transistor SX may be connected to a row decoder, e.g., the row decoder 121 of FIG. 1. A gate of the switch transistor SW may be connected to a column decoder, e.g., the column decoder 122 of FIG. 1.

Accordingly, each of a plurality of devices included in the pixel circuit may be turned on and turned off by a control signal output by a row decoder or a column decoder. For example, the first transfer transistor TX1 may be controlled by a first transfer control signal TG1 output by a row decoder, and the second transfer transistor TX2 may be controlled by a second transfer control signal TG2 output by a row decoder. The first reset transistor RX1 may be controlled by a first reset control signal RG1 output by the row decoder, the second reset transistor RX2 may be controlled by a second reset control signal RG2 output by the row decoder, and the switch transistor SW may be controlled by a switch control signal SG output by the column decoder. The select transistor SX may be controlled by a select control signal SEL output by a row decoder.

However, the connection structure between the devices of the pixel circuit and the row decoder and column decoder may vary in example embodiments. In an example embodiment, each gate of the first transfer transistor TX1, the first reset transistor RX1 and the switch transistor SW may be connected to a column decoder, and each gate of the second transfer transistor TX2, the second reset transistor RX2, and the select transistor SX may be connected to a row decoder.

As illustrated in FIG. 2, by implementing a pixel circuit and controlling at least one of the devices of the pixel circuit with a column decoder instead of a row decoder, the exposure time period of a portion of the pixels, which typically receive a control signal from the row decoder, may be controlled differently. Pixels which typically receive the control signal output by the row decoder may be selected pixels arranged along the direction in which the row control line extends.

For example, by turning on the first reset transistor RX1, the first transfer transistor TX1 and the switch transistor SW using the first reset control signal RX1, the first transfer control signal TG1 and the switch control signal SG input to the selected pixels, the first floating diffusion region FD1 and the photodiode PD of each selected pixels may be reset. Thereafter, when the second transfer transistor TX2 is turned on, electric charges of the photodiode PD may move to the second floating diffusion region FD2, and a pixel voltage corresponding to the electric charges of the photodiode PD may be output through the output line COL.

In an example embodiment, the first exposure time period of a first pixel of the selected pixels and the second exposure time period of a second pixel of the selected pixels may be configured differently by differently controlling the operation of the switch transistor SW in each of the first pixel and the second pixel. For example, the exposure times of the first and second pixels can be individually adjusted by varying the control of the switch transistor's SW operation. For example, before the first floating diffusion region FD1 and the photodiode PD of each of the first pixel and second pixel are reset and the second transfer transistor TX2 is turned on, the first transfer transistor TX1 and the first reset transistor RX1 may be turned on by a row decoder.

The column decoder may set the first exposure time period of the first pixel to be relatively longer than the second exposure time period of the second pixel by turning off the switch transistor SW of the first pixel and turning on the switch transistor SW of the second pixel, thereby configuring different exposure times for each pixel. Accordingly, the exposure time period of at least a portion of the selected pixels simultaneously controlled by the row decoder may be configured differently. By setting each pixel to have an optimal exposure time, a high-quality image having a relatively high dynamic range may be created in a single frame.

Figure 3:
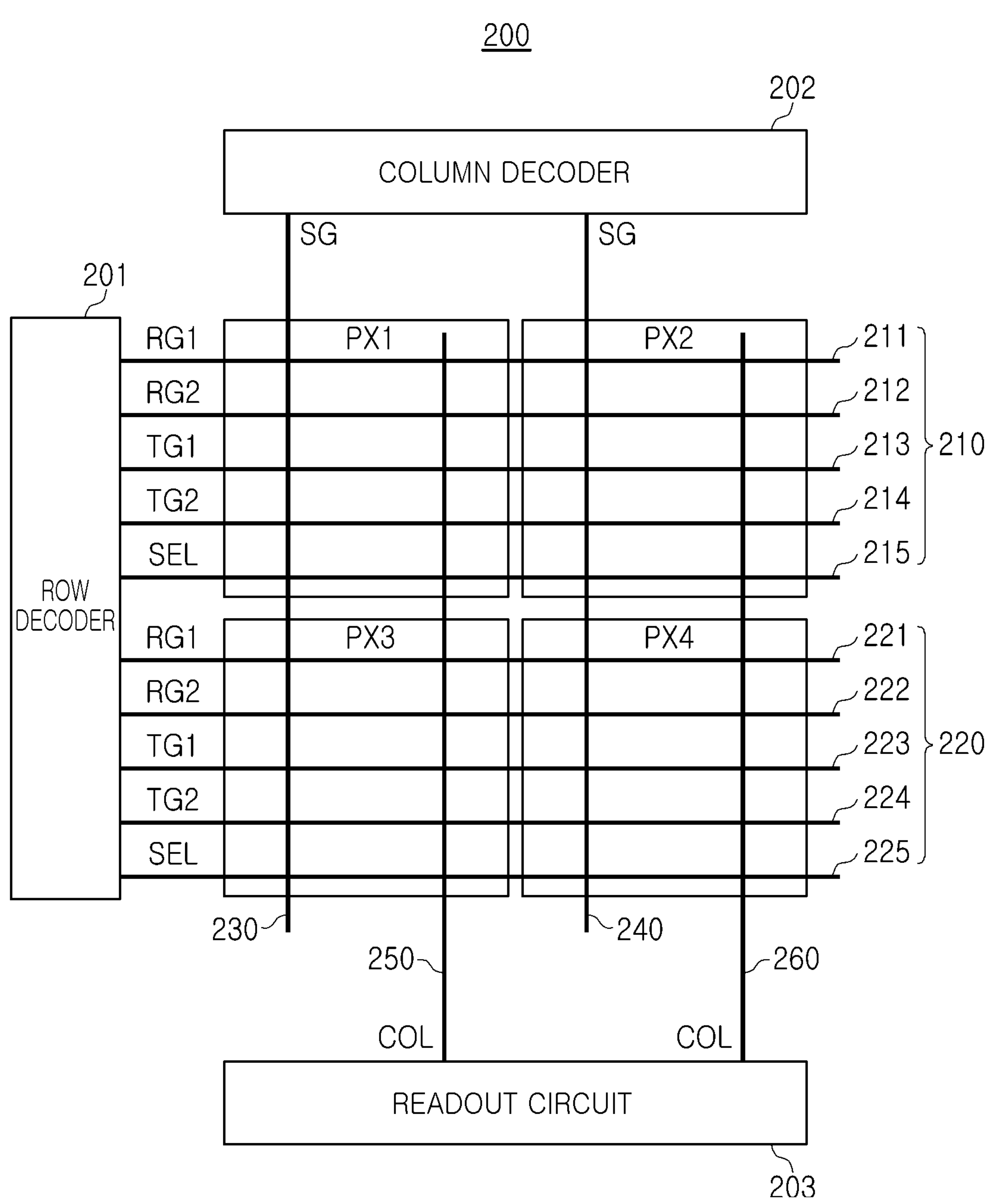
FIGS. 3 and 4 are diagrams illustrating an image sensor according to an example embodiment of the present disclosure.
Figure 4:
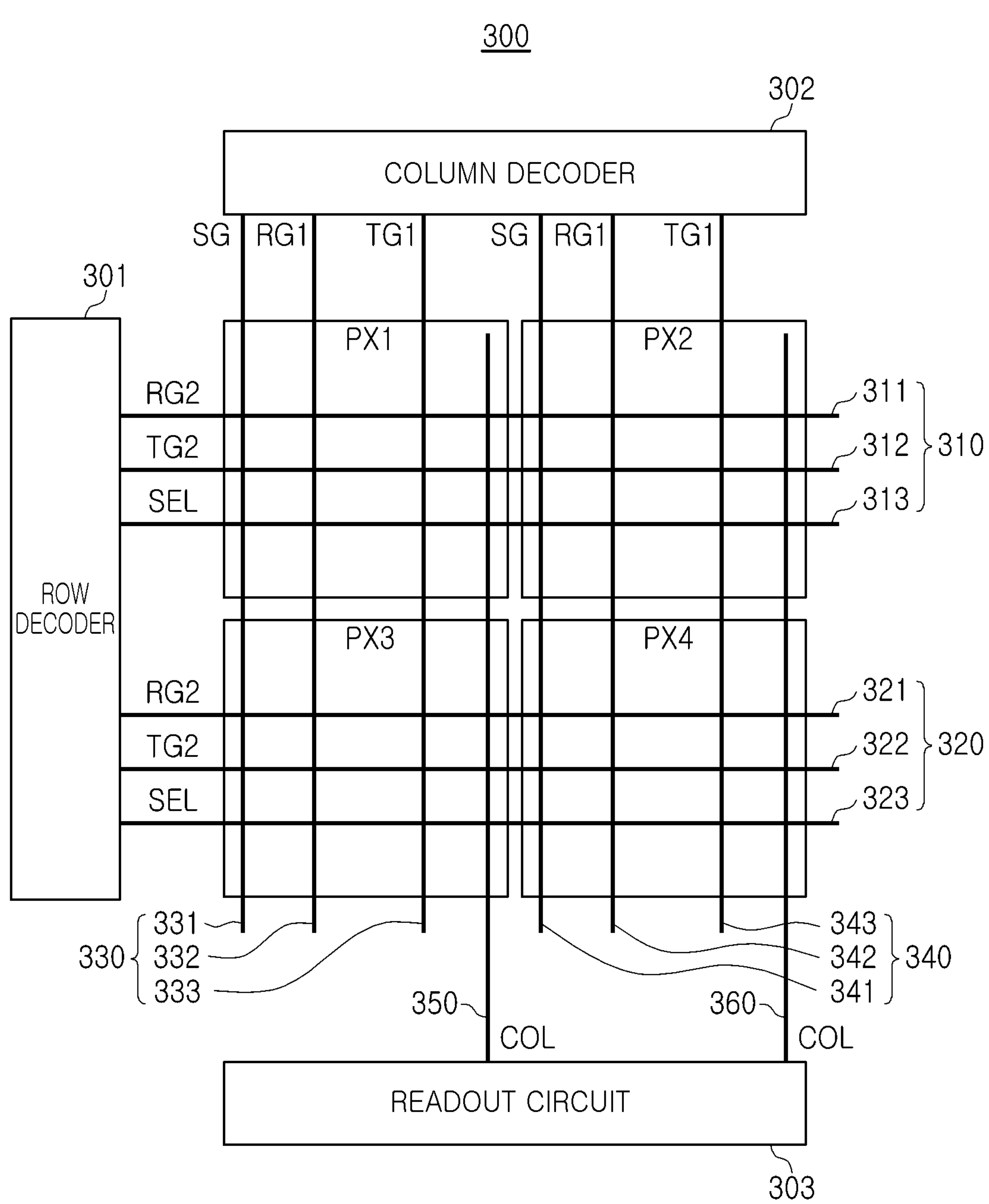

FIGS. 3 and 4 are diagrams illustrating an image sensor according to an example embodiment of the present disclosure.

Referring first to FIG. 3, an image sensor 200 may include a plurality of pixels PX1, PX2, PX3 and PX4, a row decoder 201, a column decoder 202, and a readout circuit 203. The plurality of pixels PX1-PX4 may be arranged in a first direction (the horizontal direction) and a second direction (the vertical direction). Each of the plurality of pixels PX1 to PX4 may have a structure as described above with reference to FIG. 2. Hereinafter, for ease of description, the image sensor 200 according to an example embodiment, illustrated in FIG. 3, will be described with reference to a pixel circuit diagram in FIG. 2.

The row decoder 201 may be connected to the plurality of pixels PX1-PX4 through a plurality of row control lines 210 (221, 212, 213, 214 and 215) and 220 (221, 222, 223, 224 and 225), and the column decoder 202 may be connected to the plurality of pixels PX1-PX4 through the plurality of column control lines 230 and 240. The readout circuit 203 may be connected to the plurality of pixels PX1-PX4 through a plurality of output lines 250 and 260.

A portion of pixels arranged in the first direction and arranged in the same position in the second direction may share the plurality of row control lines 210 and 220. This portion of pixels may refer to pixels arranged in a row. For example, the first pixel PX1 and the second pixel PX2 may be commonly connected to first row control lines 211-215

(210), and the third pixel PX3 and the fourth pixel PX4 may be commonly connected to second row control lines 221-225 (220).

The first row control lines 210 may include a first reset control line 211, a second reset control line 212, a first transfer control line 213, a second transfer control line 214 and a select control line 215. The first reset control line 211 may transfer the first reset control signal RG1, and the second reset control line 212 may transfer the second reset control signal RG2. The first transfer control line 213 may transfer the first transfer control signal TG1, the second transfer control line 214 may transfer the second transfer control signal TG2, and the select control line 215 may transfer the select control signal SEL. The second row control lines 220 may be configured the same as the first row control lines 210. For example, the second row control lines 220 may include a first reset control line 221, a second reset control line 222, a first transfer control line 223, a second transfer control line 224 and a select control line 225.

A portion of pixels arranged in the second direction and disposed in the same position in the first direction may share the plurality of column control lines 230 and 240 and the plurality of output lines 250 and 260. This portion of pixels may refer to pixels arranged in a column. For example, the first pixel PX1 and the third pixel PX3 may be commonly connected to the first column control line 230 and the first output line 250, and the second pixel PX2 and the fourth pixel PX4 may be commonly connected to the second column control line 240 and the second output line 260.

The column decoder 202 may output a switch control signal SG through each of the first column control line 230 and the second column control line 240. The readout circuit 203 may read a reset voltage and a pixel voltage from the plurality of pixels PX1-PX4 through the first output line 250 and the second output line 260, or may obtain a pixel signal which may be a difference between the reset voltage and the pixel voltage.

In an example embodiment, the exposure time periods of the first pixel PX1 and the second pixel PX2 simultaneously selected by the row decoder 201 may be configured differently by a switch control signal SG output by the column decoder 202. For example, when the first pixel PX1 and the second pixel PX2 are determined to be selected pixels, the first reset transistor RX1 and the first transfer transistor TX1 may be turned on in the first pixel PX1 and the second pixel PX2 by the row decoder 201, respectively. In this case, the switch transistor SW of the first pixel PX1 may be turned on by the column decoder 202 and the switch transistor SW of the second pixel PX2 may be turned off by the column decoder 202. Therefore, that the photodiode PD and the first floating diffusion region FD1 are only reset in the first pixel PX1.

Thereafter, when the first reset transistor RX1 and the first transfer transistor TX1 are turned on again in the first pixel PX1 and the second pixel PX2 by the row decoder 201, respectively, the column decoder 202 may turn off the switch transistor SW of the first pixel PX1 and may turn on the switch transistor SW of the second pixel PX2. Accordingly, the photodiode PD and the first floating diffusion region FD1 of the second pixel PX2 may be reset later than the first pixel PX1.

As such, in an example embodiment, the column decoder 202 may differently configure the reset time points of the selected pixels that share the row control lines 210 and 220. Accordingly, the exposure time periods of the selected pixels may be individually set. By configuring each of the plurality of pixels PX1-PX4 to have an optimal exposure time period, an image having a relatively high dynamic range may be created in only a single frame.

Thereafter, referring to FIG. 4, an image sensor 300 may include a plurality of pixels PX1-PX4, a row decoder 301, a column decoder 302, and a readout circuit 303. The plurality of pixels PX1-PX4 may be arranged in a first direction (the horizontal direction) and a second direction (the vertical direction). Similarly to an example embodiment described with reference to FIG. 3, the readout circuit 303 may be connected to the plurality of pixels PX1-PX4 through a plurality of output lines 350 and 360.

The row decoder 301 may be connected to the plurality of pixels PX1-PX4 through the plurality of row control lines 310 (311, 312, 313) and 320 (321, 322, 323). In an example embodiment illustrated in FIG. 4, the first row control lines 310 may include a second reset control line 311, a second transfer control line 312 and a select control line 313. The second reset control line 311 may transfer the second reset control signal RG2, the second transfer control line 312 may transfer the second transfer control signal TG2, and the select control line 313 may transfer the select control signal SEL. The second row control lines 320 may be configured the same as the first row control lines 310. For example, the second row control lines 320 may include a second reset control line 321, a second transfer control line 322 and a select control line 323.

The column decoder 302 may be connected to the plurality of pixels PX1-PX4 through a plurality of column control lines 330 (331, 332, 333) and 340 (341, 342, 343). Referring to FIG. 4, the first column control lines 330 may include a switch control line 331, a first reset control line 332 and a first transfer control line 333. The column decoder 302 may output a switch control signal SG through the switch control line 331, a first reset control signal RG1 through the first reset control line 332, and a first transfer control signal TG1 through the first transfer control line 333. The configuration of the second column control lines 340 may be the same as that of the first column control lines 330. For example, the second column control lines 304 may include a switch control line 341, a first reset control line 342 and a first transfer control line 343.

In an example embodiment illustrated in FIG. 4, a reset time point of each selected pixel arranged in the first direction and disposed in the same position in the second direction may be determined by the column decoder 302. For example, when the first pixel PX1 and the second pixel PX2 arranged in the first row are determined as selected pixels, the column decoder 302 may reset the photodiode PD and the first floating diffusion region FD1 of the first pixel PX1 by turning on the first reset transistor RX1 and the first transfer transistor TX1 and the switch transistor SW of the first pixel PX1 at a first time point.

In addition, the column decoder 302 may reset the photodiode PD of the second pixel PX2 and the first floating diffusion region FD1 by turning on the first reset transistor RX1 and the first transfer transistor TX1 and the switch transistor SW of the second pixel PX2 at a second time point different from the first time point. The readout circuit 303 may obtain the pixel voltage from each of the first pixel PX1 and the second pixel PX2 at the same time point. Therefore, the exposure time period of each of the first pixel PX1 and the second pixel PX2 may be individually configured depending on the difference between the first time point and the second time point.

Figure 5:
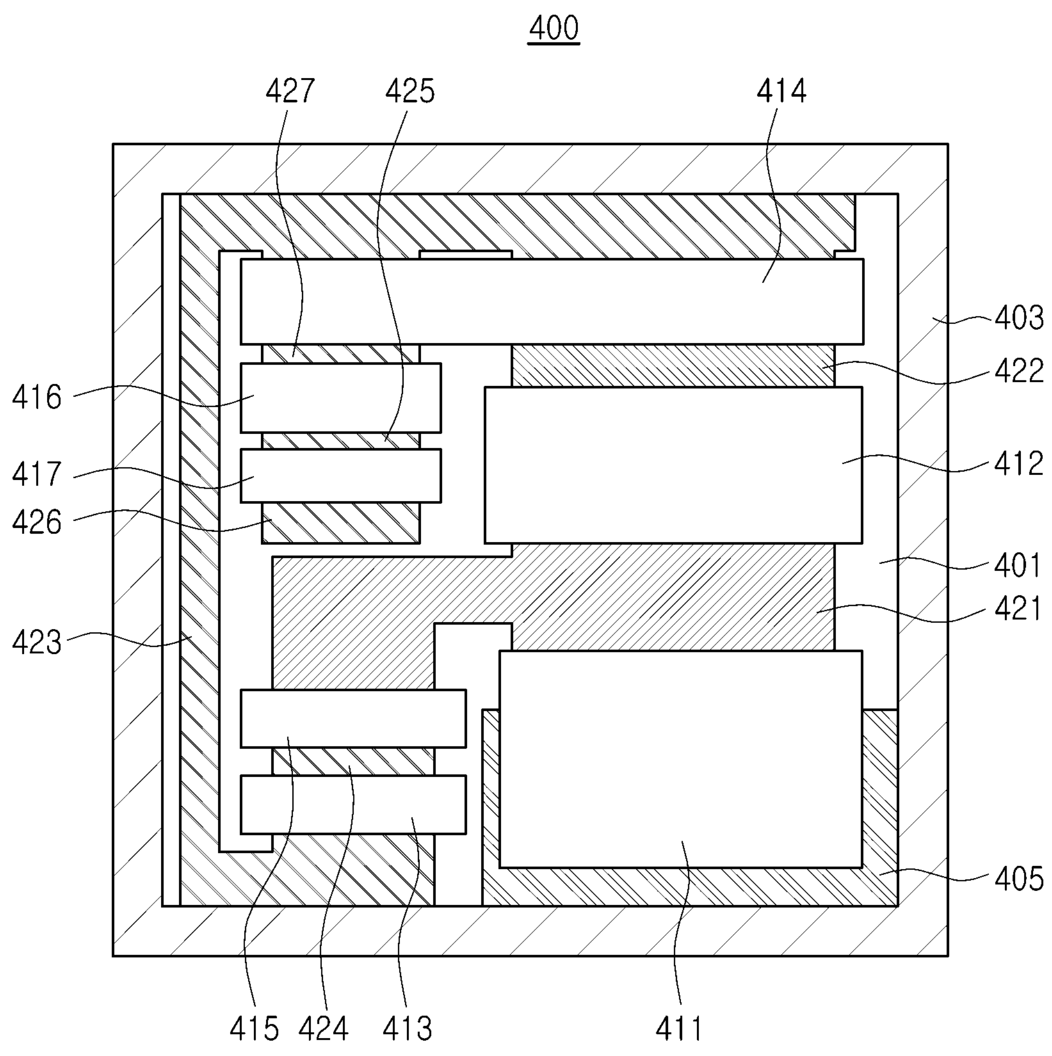
FIGS. 5 and 6 are diagrams illustrating pixels included in an image sensor according to an example embodiment of the present disclosure.
Figure 6:
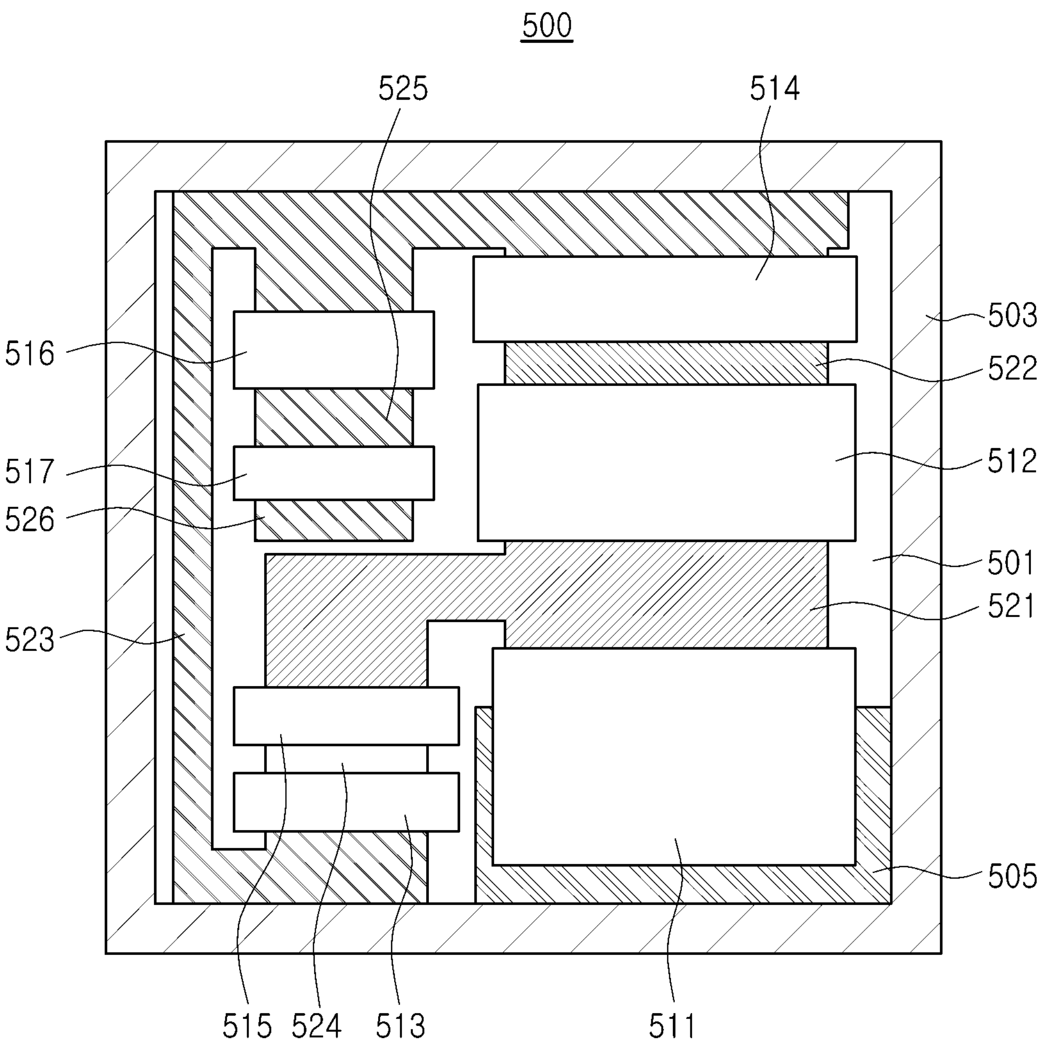

FIGS. 5 and 6 are diagrams illustrating pixels included in an image sensor according to an example embodiment of the present disclosure.

Referring first to FIG. 5, in an image sensor according to an example embodiment, a pixel 400 may be distinct from other pixels by a pixel separation film 403 formed on a substrate 401. A plurality of gates 411, 412, 413, 414, 415, 416 and 417 and a plurality of active regions 421, 422, 423, 424, 425, 426 and 427 may be disposed in a region in the pixel separation film 403. The plurality of gates 411 to 417 and the plurality of active regions 421 to 427 may provide a plurality of devices included in a pixel circuit.

The first transfer gate 411 may have a region overlapping a photodiode 405 formed in the substrate 401. For example, at least a portion of the first transfer gate 411 may be buried in the substrate 401. The first active region 421 disposed between the first transfer gate 411 and the second transfer gate 412 may provide a first floating diffusion region. A second floating diffusion region may be provided by the second active region 422 disposed between the second transfer gate 412 and the second reset gate 414. In an example embodiment, an area of the first active region 421 may be greater than an area of the second active region 422. Accordingly, capacity of the first floating diffusion region may be greater than that of the second floating diffusion region.

The third active region 423 may be adjacent to the second reset gate 414 and the first reset gate 413. The third active region 423 may provide a power node to which a power voltage is applied. The fourth active region 424 may be disposed between the first reset gate 413 and the switch gate 415, and may provide active regions of the first reset transistor, e.g., RX1, and the switch transistor, e.g., SW, connected to each other in series. The fifth active region 425 may be disposed between the source-follower gate 416 and the select gate 417, and the sixth active region 426 may be disposed on one side of the select gate 427 and may be electrically connected to an output line connected to a readout circuit. The seventh active region 427 may be disposed between the source-follower gate 416 and the second reset gate 414, and may provide a power node to which a power voltage is applied.

The gates 411 to 415 (417) excluding the source-follower gate 416 may be connected to a row decoder through a row control line or may be connected to a column decoder through a column control line. For example, when an image sensor including pixel 400 has the same structure as in the example embodiment described above with reference to FIG. 3, the other gates 411 to 415 (417) other than the switch gate 415 may be connected to the row decoder through the row control lines, and the switch gate 415 may be connected to the column decoder through the column control lines. When the image sensor including the pixel 400 has the same structure as in the example embodiment described with reference to FIG. 4, the first transfer gate 411, the first reset gate 413 and the switch gate 415 may be connected to a column decoder, and the second transfer gate 412, the second reset gate 414, and the select gate 417 may be connected to a row decoder.

The layout of the pixel 400 is not limited to the example illustrated in FIG. 5 and may be varied in example embodiments. For example, referring to FIG. 6, a pixel 500 may include a plurality of gates 511, 512, 513, 514, 515, 516 and 517, a plurality of active regions 521, 522, 523, 524, 525 and 526, and a photodiode 505 disposed in a pixel separation film 503 formed on a substrate 501.

In the example embodiment illustrated in FIG. 6, the second reset gate 514 may have a relatively small area, and a power node for supplying a power voltage may be provided by an active region, for example, the third active region 523. In addition, a third active region 523 providing a power node may be directly adjacent to a source-follower gate 516. Accordingly, as compared to an example embodiment illustrated in FIG. 5, the size of the source-follower transistor, e.g., SF, may be increased and noise properties may be improved.

Figure 7:
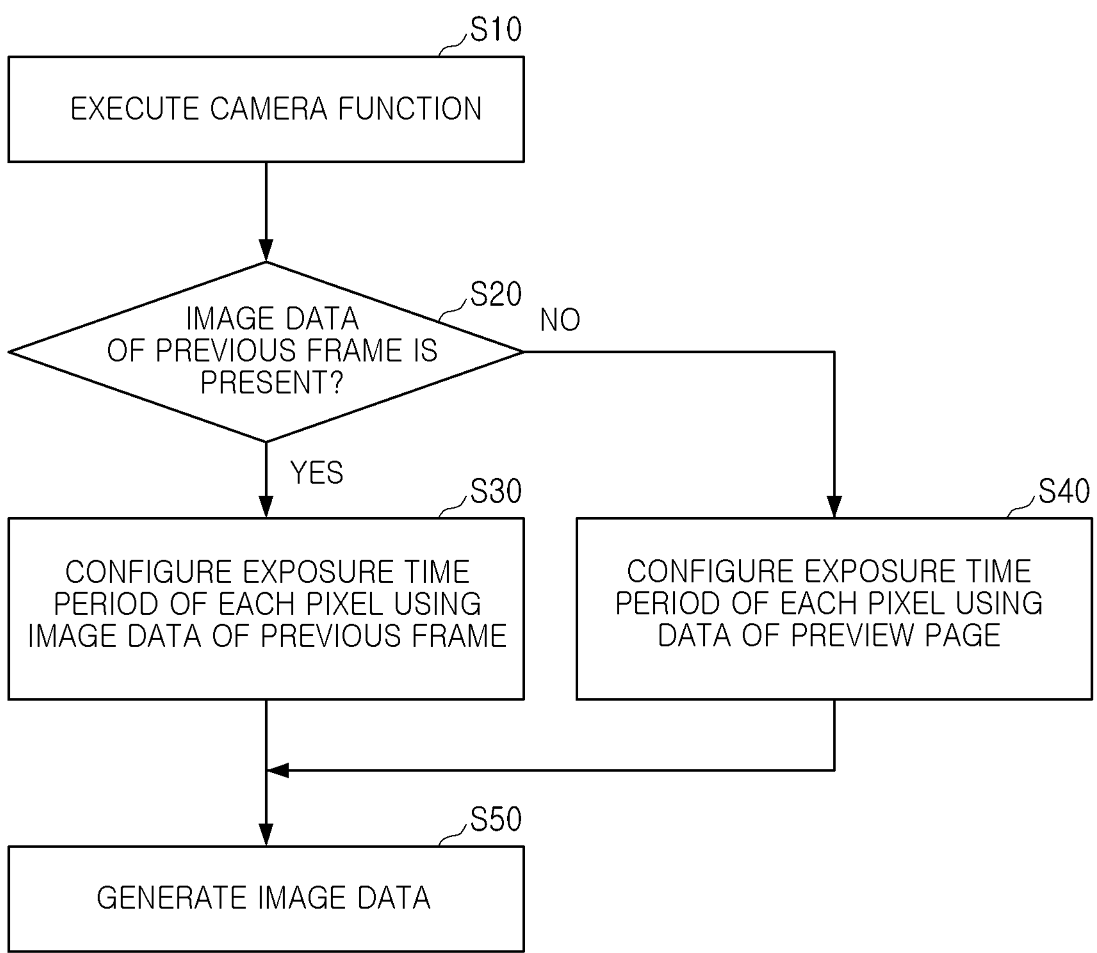
FIG. 7 is a flowchart illustrating operations of an image sensor according to an example embodiment of the present disclosure.

FIG. 7 is a flowchart illustrating operations of an image sensor according to an example embodiment of the present disclosure.

Referring to FIG. 7, an image sensor according to an example embodiment may start with an operation in which a camera function is executed in an electronic device including the image sensor (S10). For example, an electronic device including an image sensor may be implemented as a mobile device such as a tablet personal computer (PC), a smart phone, or a digital camera.

When a camera function is executed, a processor linked to an image sensor, for example, an application processor, may determine whether image data generated in the previous frame is present (S20). The image data generated by the previous frame may be generated by the previous frame when the image sensor operates in a video capturing mode or a continuous shooting mode.

When it is determined that image data of the previous frame is present in operation S20, the processor may configure the exposure time period of each pixel using the image data of the previous frame (S30). The processor may configure an exposure time period for each pixel included in the image sensor and may transfer the time period to the image sensor. The image sensor may individually configure the exposure time period of each pixel on the basis of information received from the processor.

When it is determined that image data of the previous frame is not present in operation S20, the processor may configure the exposure time period of each pixel using data of a preview page output to the display after the camera function is executed (S40). The image sensor may receive the exposure time period of each pixel configured by the processor on the basis of the preview page, and may control the pixels on the basis of the time period.

The image sensor may perform imaging using the exposure time period of each pixel determined in operation S30 or operation S40 and may generate image data (S50). For example, when it is determined that the exposure time period of the first pixel is excessively long and the exposure time period of the second pixel is excessively short on the basis of the image data of the previous frame, the image sensor may shorten the exposure time period of the first pixel on the basis of the information received from the processor and may increase the exposure time period of the second pixel. When the preview page determines that light intensity flowing into the first pixel is extremely weak and light intensity flowing into the second pixel is extremely strong, the image sensor may increase the exposure time period of the first pixel and may shorten the exposure time period of the second pixel on the basis of the information received from the processor.

Figure 8A:
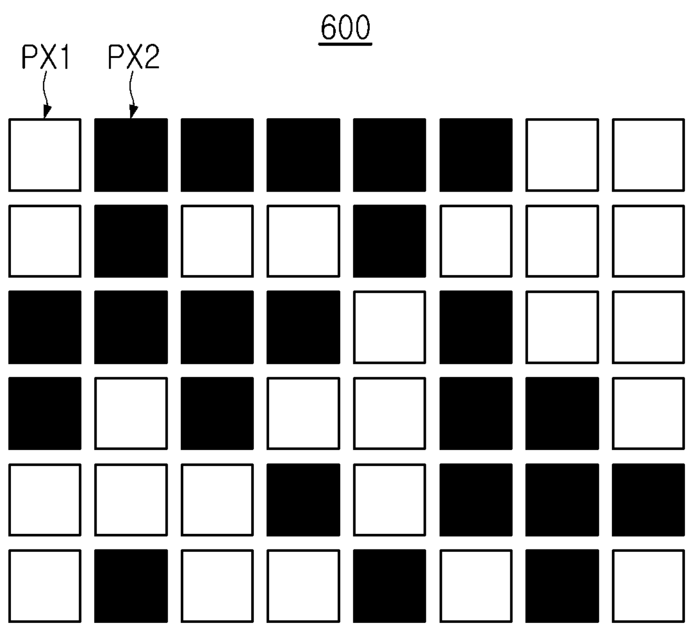
FIGS. 8A and 8B are diagrams illustrating operations of an image sensor according to an example embodiment of the present disclosure.
Figure 8B:
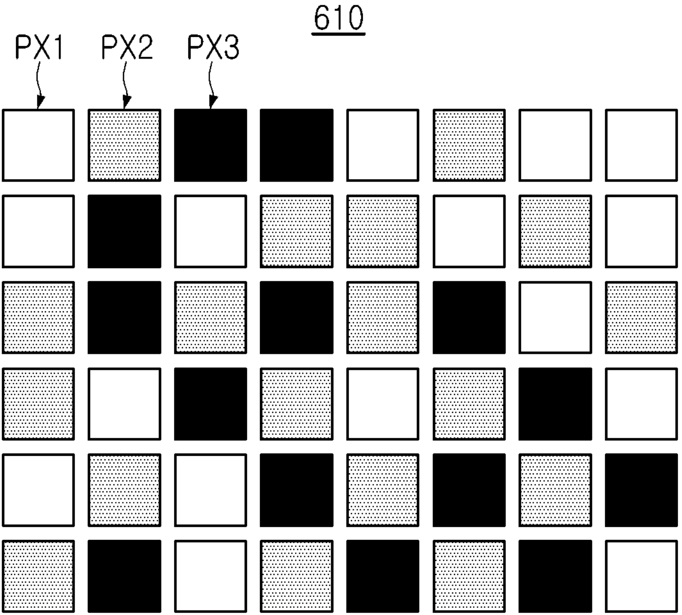

FIGS. 8A and 8B are diagrams illustrating operations of an image sensor according to an example embodiment of the present disclosure.

FIGS. 8A and 8B may be diagrams illustrating an operation of individually configuring an exposure time period for each pixel in an image sensor. First, in the example embodiment illustrated in FIG. 8A, an image sensor 600 may divide pixels into a first pixel PX1 having a relatively long exposure time period and a second pixel PX2 having a relatively short exposure time period. As described above, the image sensor 600 may configure the pixels as the first pixel PX1 or the second pixel PX2 by referring to information generated by the processor from at least one of the image data of the previous frame and the preview page.

In an example embodiment illustrated in FIG. 8B, the image sensor 610 may configure each pixel to one of the first pixel PX1, the second pixel PX2 and the third pixel PX3. The first exposure time period of the first pixel PX1 may be longer than the second exposure time period of the second pixel PX2 and the third exposure time period of the third pixel PX3. The second exposure time period of the second pixel PX2 may be longer than the third exposure time period of the third pixel PX3. In other words, the first pixel PX1 may have the longest exposure time period and the third pixel PX3 may have the shortest exposure time period.

The image sensor 600 according to an example embodiment illustrated in FIG. 8A may configure the exposure time period of each pixel to be divided into two stages, and the image sensor 610 according to an example embodiment illustrated in FIG. 8B may configure the exposure time period of each pixel to be divided into three stages. However, in example embodiments, the image sensor may separately configure the exposure time period of each pixel to be divided into fourth stages or more.

As described above, the exposure time period of each pixel may be individually configured by resetting each pixel to a different time point. In other words, each pixel's exposure time can be controlled by resetting each pixel at a different time point. For example, a first pixel can be reset at a first time point and a second pixel can be reset at a second time point different from the first time point. The readout operation of reading the reset voltage and the pixel voltage from each pixel may be executed simultaneously in the pixels disposed in the same row, and accordingly, the image sensor may implement the high dynamic range (HDR) function within a single frame.

Figure 9:
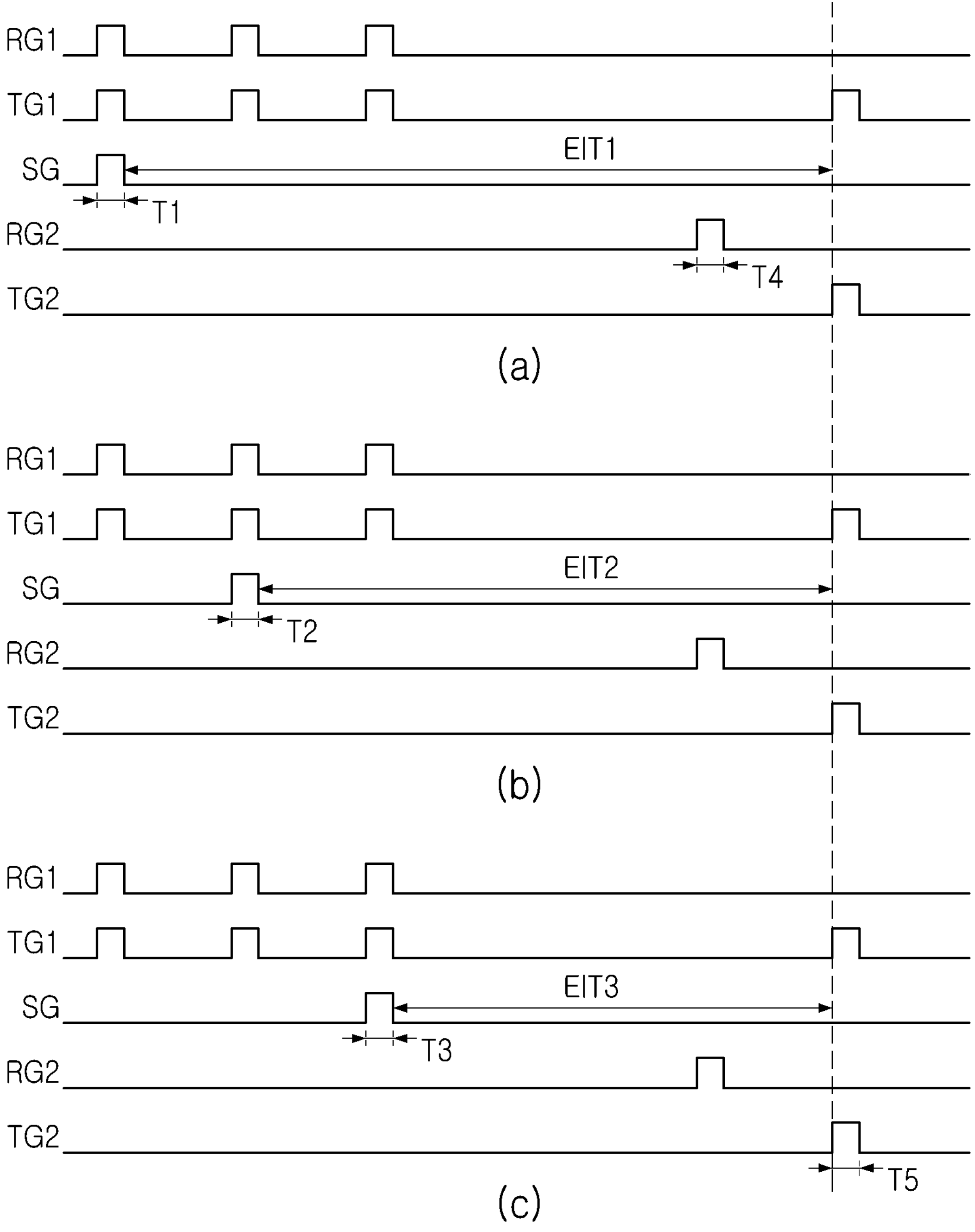
FIG. 9 is a timing diagram illustrating operations of an image sensor according to an example embodiment of the present disclosure.

FIG. 9 is a timing diagram illustrating operations of an image sensor according to an example embodiment of the present disclosure.

In an example embodiment described with reference to FIG. 9, the image sensor may divide the exposure time period of each pixel into three stages as described above with reference to FIG. 8B. The exposure time period of each pixel may be determined as one of a first exposure time period, a second exposure time period shorter than the first exposure time period, and a third exposure time period shorter than the second exposure time period.

In an example embodiment illustrated in FIG. 9, timing diagram (a) may indicate the operation of a first pixel configured to have a first exposure time period, timing diagram (b) may indicate the operation of a second pixel configured to have a second exposure time period, and timing diagram (c) may indicate the operation of the third pixel configured to have a third exposure time period. The first pixel, the second pixel, and the third pixel may share row control lines. For example, the first pixel, the second pixel, and the third pixel may be selected pixels that are selected simultaneously by the row decoder. Hereinafter, for ease of description, operation of the image sensor will be described with reference to the pixel circuit diagram illustrated in FIG. 2.

Referring to FIG. 9, a reset operation of a first pixel may be executed during a first time period T1. During the first time period T1, the first reset transistor RX1, the first transfer transistor TX1 and the switch transistor SW may be turned on in the first pixel by the first reset control signal RG1, the first transfer control signal TG1 and the switch control signal SG, each having a high level. Accordingly, a reset operation in which electric charges of the photodiode PD and the first floating diffusion region FD1 are removed may be executed. When the first time period T1 ends, a first exposure time period EIT1, in which the photodiode PD of the first pixel is exposed to light and generates electric charges, may begin.

During the first time period T1, the first reset transistor RX1 and the first transfer transistor TX1 may be turned on in each of the second pixel and the third pixel. However, in the second pixel and the third pixel, the switch transistor SW may not be turned on during the first time period T1. For example, the switch control signal SG may have a low level. Accordingly, the photodiode PD and the first floating diffusion region FD1 may not be reset. Since each of the selected pixels simultaneously selected by the row decoder individually receives the switch control signal SG from the column decoder, the switch transistor SW in each of the first to third pixels may be independently controlled.

Referring to FIG. 9, the reset operation of the second pixel may be executed during the second time period T2 after the first time period T1. During the second time period T2, the first reset transistor RX1, the first transfer transistor TX1 and the switch transistor SW may be turned on in the second pixel by the first reset control signal RG1, the first transfer control signal TG1 and the switch control signal SG, each having the high level. Accordingly, a reset operation in which electric charges of the photodiode PD and the first floating diffusion region FD1 are removed from the second pixel may be executed. When the second time period T2 ends, a second exposure time period EIT2, in which the photodiode PD of the second pixel is exposed to light and generates electric charges, may begin. The second exposure time period EIT2 may be shorter than the first exposure time period EIT1.

During the second time period T2, the switch transistor SW of the first pixel and the third pixel may maintain a turned-off state, e.g., the switch control signal SG may have the low level. Accordingly, in the first pixel and the third pixel, the reset operation may not be executed even though the first reset transistor RX1 and the first transfer transistor TX1 are turned on. However, in the first pixel, at least a portion of electric charges generated by the photodiode PD may be transferred to the first floating diffusion region FD1 by the turning-on of the first transfer transistor TX1 between an end point of the first time period T1 and a start point of the second time period T2.

Thereafter, during the third time period T3 after the second time period T2, the reset operation of the third pixel may be executed. During the third time period T3, by first reset control signal RG1, the first transfer control signal TG1 and the switch control signal SG having the high level, the first reset transistor RX1, the first transfer transistor TX1 and the switch transistor SW may be turned on in the third pixel. Accordingly, a reset operation in which electric charges of the photodiode PD and the first floating diffusion region FD1 are removed may be executed in the third pixel. When the third time period T3 ends, a third exposure time period EIT3, in which the photodiode PD of the third pixel is exposed to light and generates electric charges, may start. The third exposure time period EIT3 may be shorter than the second exposure time period EIT2.

During the third time period T3, the switch transistor SW of the first pixel and the second pixel may maintain a turned-off state, e.g., the switch control signal SG may have the low level. Accordingly, in the first pixel and the second pixel, the reset operation may not be executed even though the first reset transistor RX1 and the first transfer transistor TX1 are turned on. However, a portion of electric charges of the photodiode PD in each of the first pixel and the second pixel may move to the first floating diffusion region FD1 by the turning-on of the first transfer transistor TX1.

In the fourth time period T4, the second floating diffusion region FD2 may be reset in each of the first to third pixels. Referring to FIG. 9, the second reset transistor RX2 may be turned on in each of the first to third pixels by the second reset control signal RG2 output by the row decoder during the fourth time period T4. Herein the second reset control signal RG2 may have the high level. In other words, the second reset transistor RX2 may be turned on after the latest third time period T3 among the time periods T1-T3 executed during the reset operation. Accordingly, the second floating diffusion region FD2 may be connected to the power node, and a voltage of the second floating diffusion region FD2 may be reset. During the fourth time period T4 or after the fourth time period T4 has elapsed, the readout circuit may read a reset voltage from each of the first to third pixels.

The first to third exposure time periods EIT1-EIT3 may end at the same time point. For example, each of the first to third exposure time periods EIT1-EIT3 may be the time period from the last time point at which the switch transistor SW transitions from a turned-on state to a turned-off state in each of the first to third pixels to the time point at which second transfer transistor TX2 transitions from a turned-off state to a turned-on state in each of the first to third pixels.

Referring to FIG. 9, during the fifth time period T5, the first transfer transistor TX1 and the second transfer transistor TX2 may be turned on in each of the first to third pixels by the first transfer control signal TG1 and the second transfer control signal TG2 output by the row decoder. Accordingly, in each of the first to third pixels, electric charges stored in the photodiode PD and the first floating diffusion region FD1 may move to the second floating diffusion region FD2. The readout circuit may read the pixel voltage from each of the first to third pixels during the fifth time period T5, and may generate a pixel signal corresponding to the difference between the reset voltage and the pixel voltage.

According to an example embodiment, the image sensor may divide the exposure time period of each pixel into two stages or four stages or more, instead of three stages. When the image sensor divides the exposure time period of each pixel into two stages, the image sensor may control the first pixel of the pixels as illustrated in the timing diagram (a), and may control the second pixel as illustrated in the timing diagram (b) or (c).

FIGS. 10 to 15 are diagrams illustrating operations of an image sensor according to an example embodiment of the present disclosure.

Figure 10:
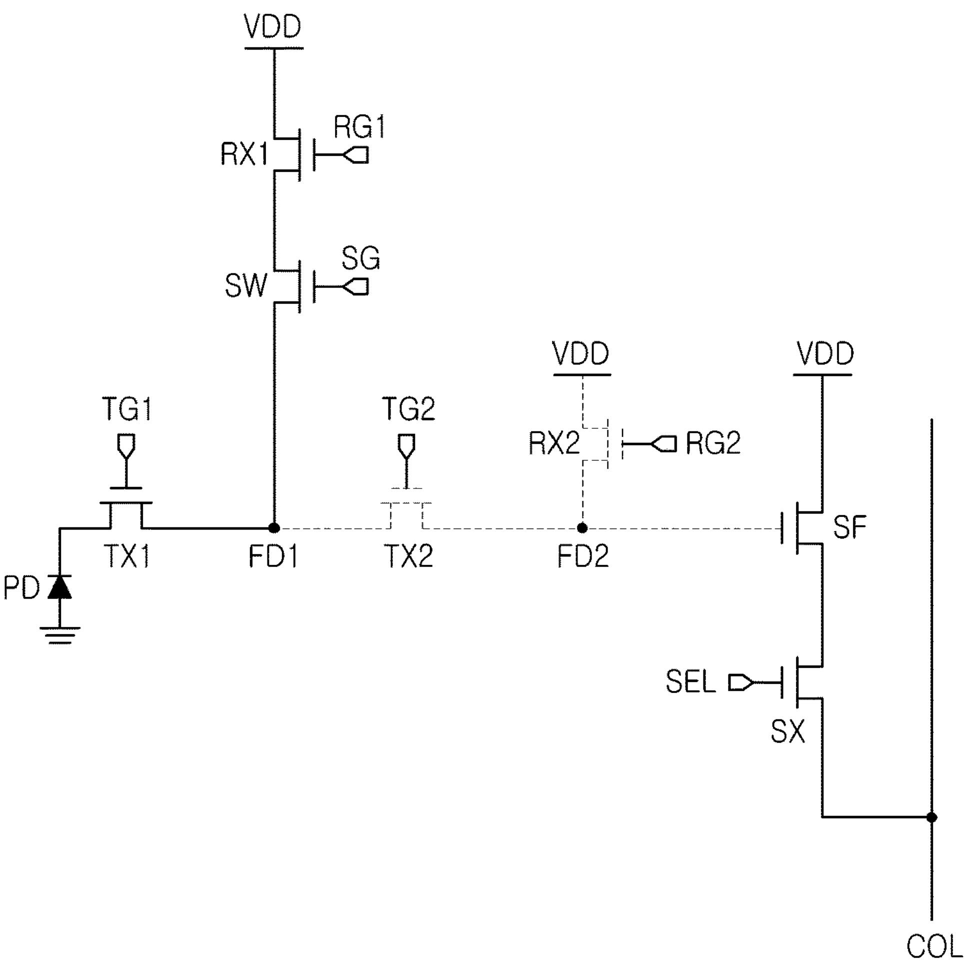
FIGS. 10, 11, 12, 13, 14 and 15 are diagrams illustrating operations of an image sensor according to an example embodiment of the present disclosure.

FIG. 10 may indicate an operation of a pixel in a reset operation. As an example, FIG. 10 illustrates an operation of the first pixel during the first time period T1, an operation of the second pixel during the second time period T2, and an operation of the third pixel during the third time period T3 in an example embodiment described with reference to FIG. 9.

As described above with reference to FIG. 9, in the reset operation, the first reset transistor RX1, the first transfer transistor TX1 and the switch transistor SW of a pixel may be turned on. The second transfer transistor TX2 and the second reset transistor RX2 may remain turned off. Accordingly, as illustrated in FIG. 10, the photodiode PD and the first floating diffusion region FD1 may be connected to the power node and may be reset. The first reset control signal RG1, the first transfer control signal TG1, the second transfer control signal TG2 and the second reset control signal RG2 may be output by a row decoder, and the switch control signal SG may be output by the column decoder.

Figure 11:
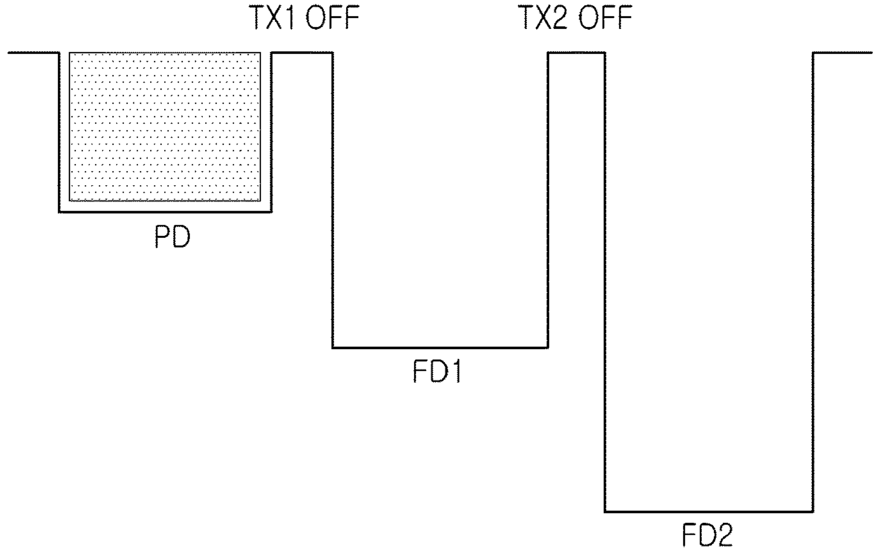

FIG. 11 may be a diagram illustrating an operation of a pixel after a reset operation is completed. As described with reference to FIG. 9, in the pixel for which the reset operation is completed, the photodiode PD may generate electric charges in response to light during the exposure time period. During the exposure time period when the photodiode PD generates electric charges in response to light, as the first transfer transistor TX1 and the second transfer transistor TX2 remain turned off, electric charges of the photodiode PD may not move to the first floating diffusion region FD1 or the second floating diffusion region FD2.

Figure 12:
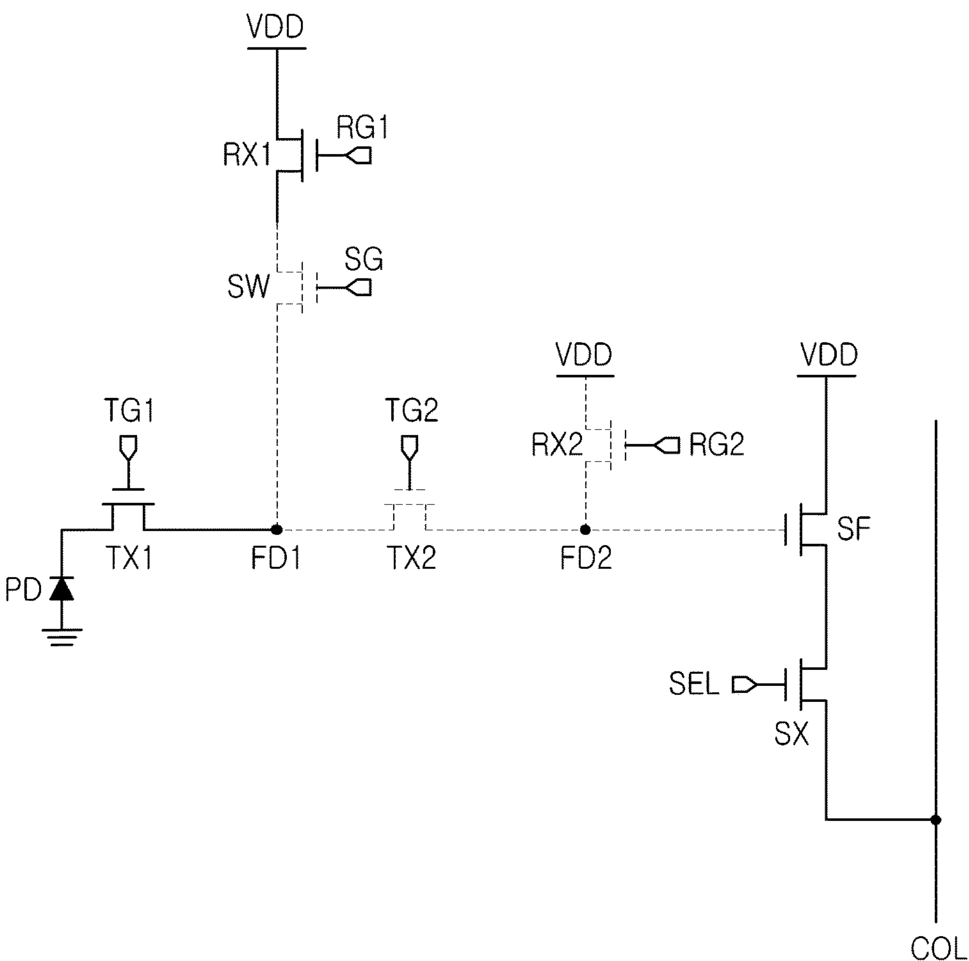

FIG. 12 may be a diagram illustrating an operation of the first pixel during the second time period T2 and an operation of the first pixel and the second pixel during the third time period T3 in an example embodiment described with reference to FIG. 9. Referring to FIG. 12, to perform a reset operation on another pixel, the first reset transistor RX1 and the first transfer transistor TX1 may be turned on in a pixel. However, different from other pixels in which the reset operation is executed, since the switch transistor SW maintains the turned-off state, the photodiode PD and the first floating diffusion region FD1 may not be reset.

Figure 13:
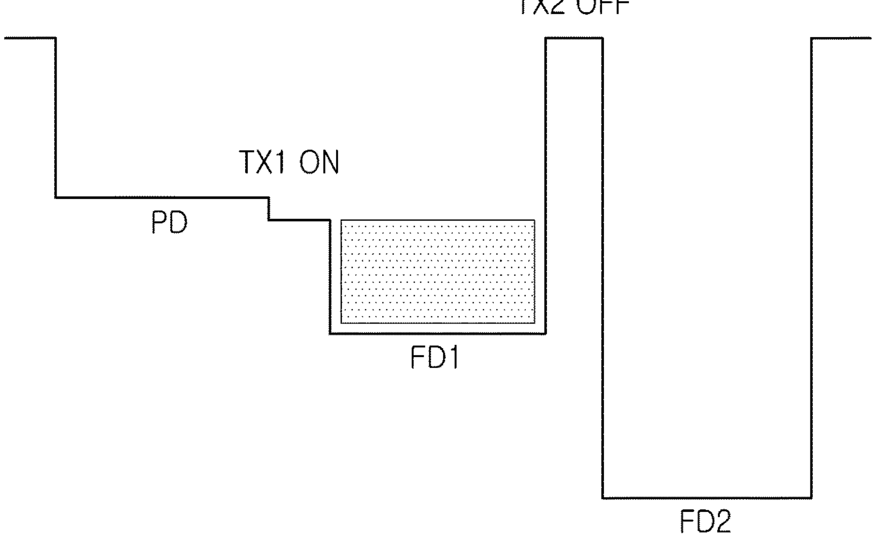

FIG. 13 may be a diagram illustrating movement of electric charges appearing in the operation illustrated in FIG. 12. Referring to FIG. 12, different from the configuration in which the switch transistor SW is turned off and the photodiode PD and the first floating diffusion region FD1 are not reset, the photodiode PD may be connected to the first floating diffusion region FD1 as the first transfer transistor TX1 is turned on. Accordingly, as illustrated in FIG. 13, at least a portion of electric charges of the photodiode PD may move to the first floating diffusion region FD1.

As such, in the first pixel and the second pixel having a relatively long exposure time period, at least a portion of electric charges generated by the photodiode PD may move to the first floating diffusion region FD1 in advance. Accordingly, the photodiode PD may be prevented from being saturated although the long exposure time period is configured, and quality of the image may be improved by improving a dynamic range of the image sensor.

Figure 14:
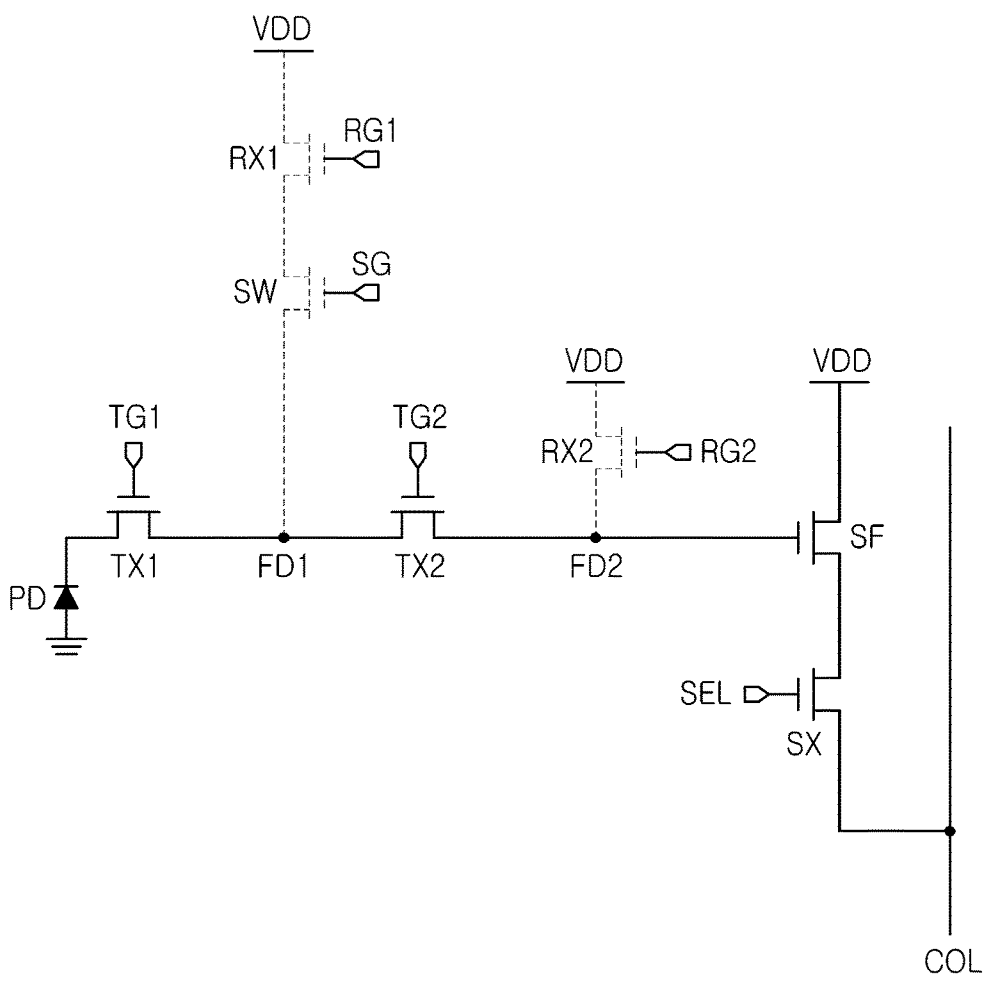
Figure 15:
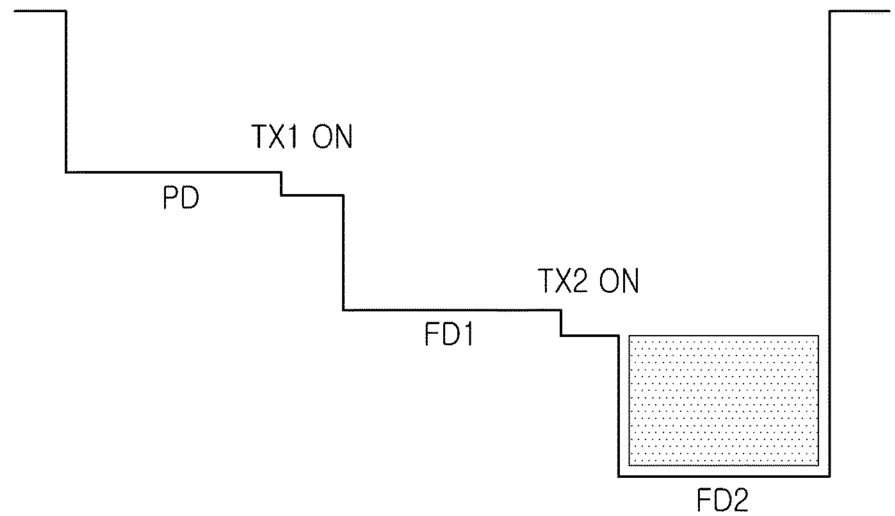

FIG. 14 may be a diagram illustrating an operation of pixels during the fifth time period T5 in an example embodiment described with reference to FIG. 9. First, during the fourth time period T4 prior to the fifth time period T5, the second reset transistor RX2 may be turned on in each pixel, and electric charges of the second floating diffusion region FD2 may be removed.

Referring to FIG. 14, during a fifth time period T5, the first transfer transistor TX1 and the second transfer transistor TX2 are turned on, and the photodiode PD1, the first floating diffusion region FD1, and the second floating diffusion region FD2 may be connected to each other. Accordingly, electric charges accumulated in the photodiode PD and the first floating diffusion region FD1 before the start point of the fifth time period T5 may move to the second floating diffusion region FD2, see FIG. 15. The readout circuit of the image sensor may read the pixel voltage corresponding to a voltage of the second floating diffusion region FD2 through the output line COL.

Figure 16:
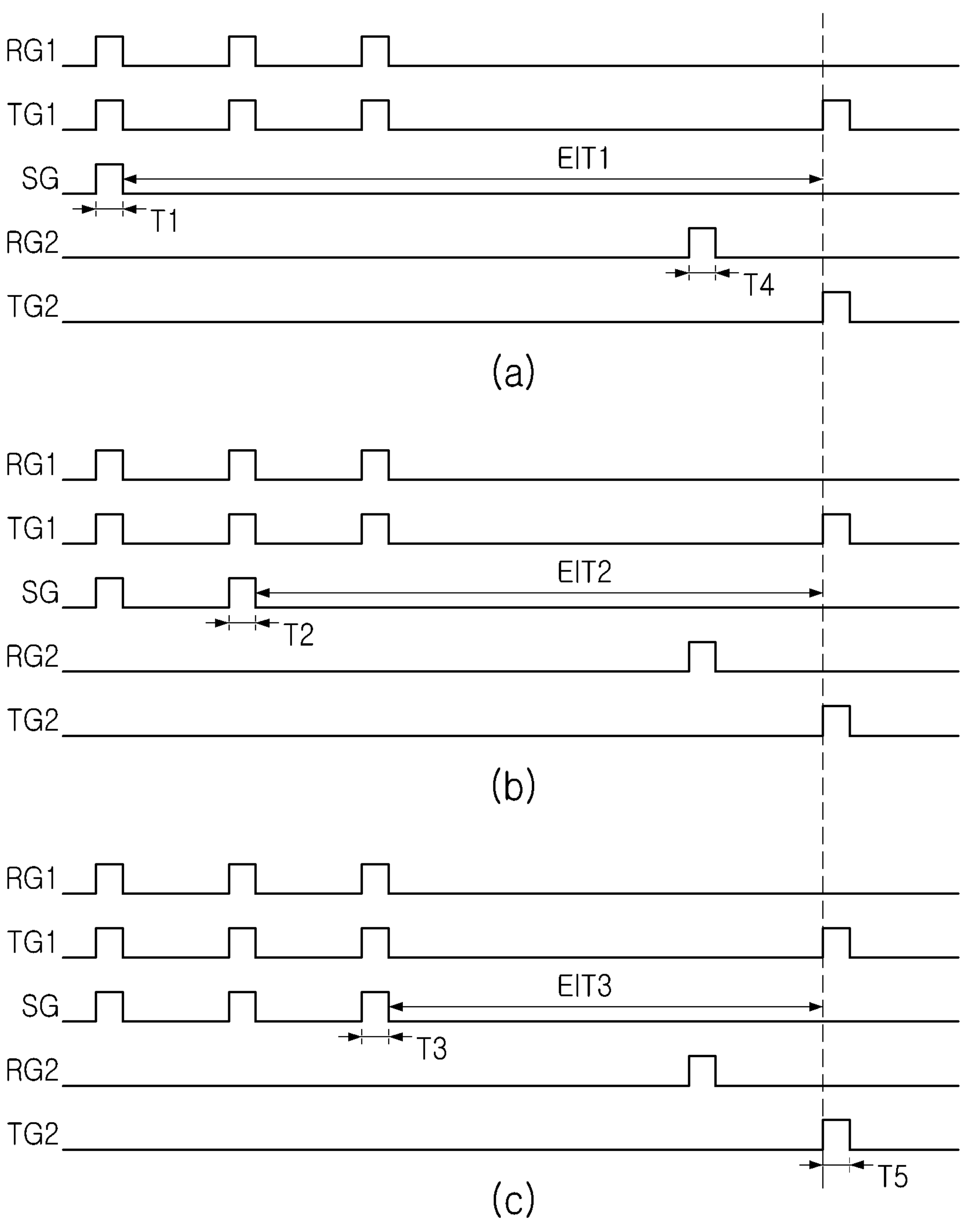
FIGS. 16, 17 and 18 are timing diagrams illustrating operations of an image sensor according to an example embodiment of the present disclosure.
Figure 17:
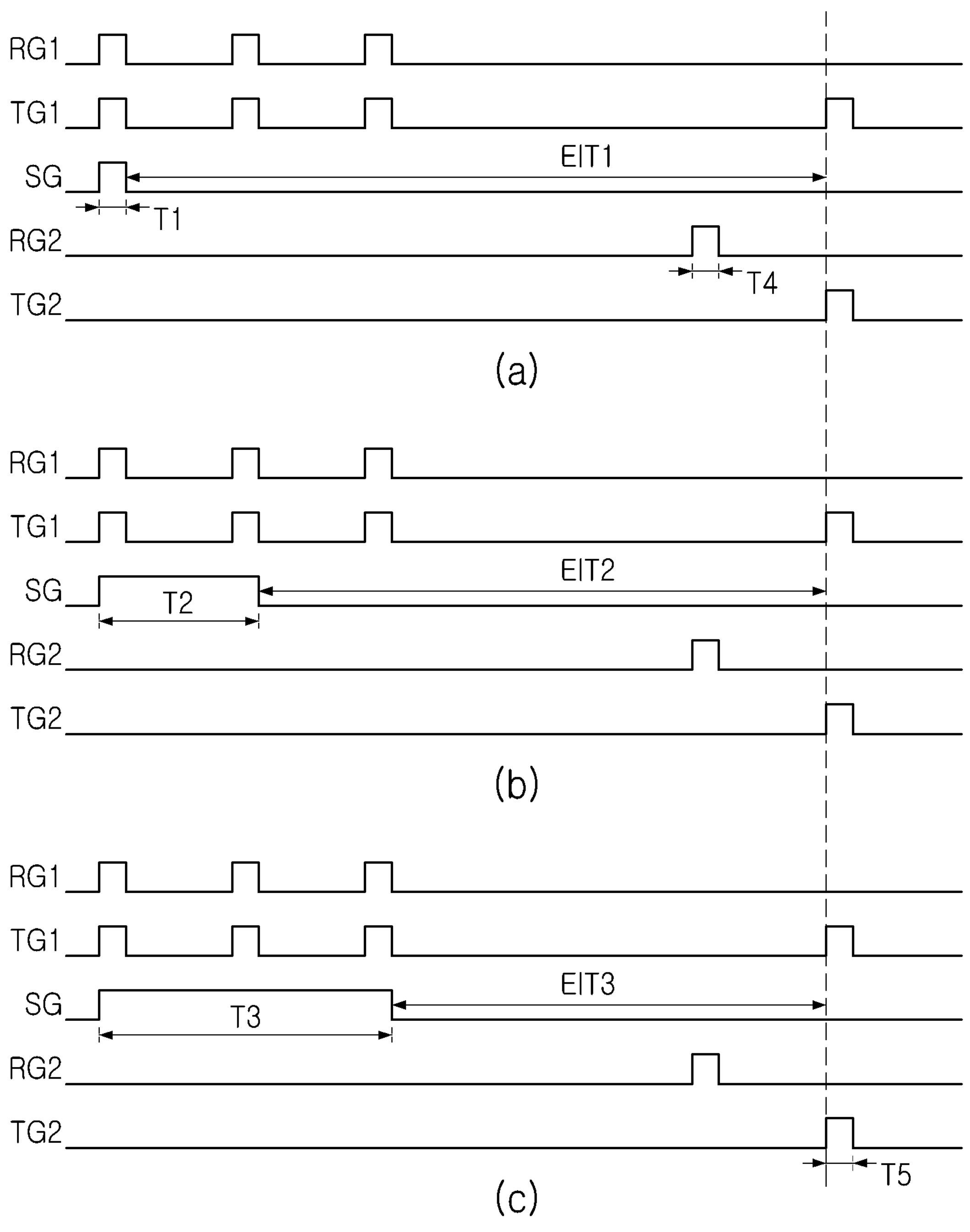
Figure 18:
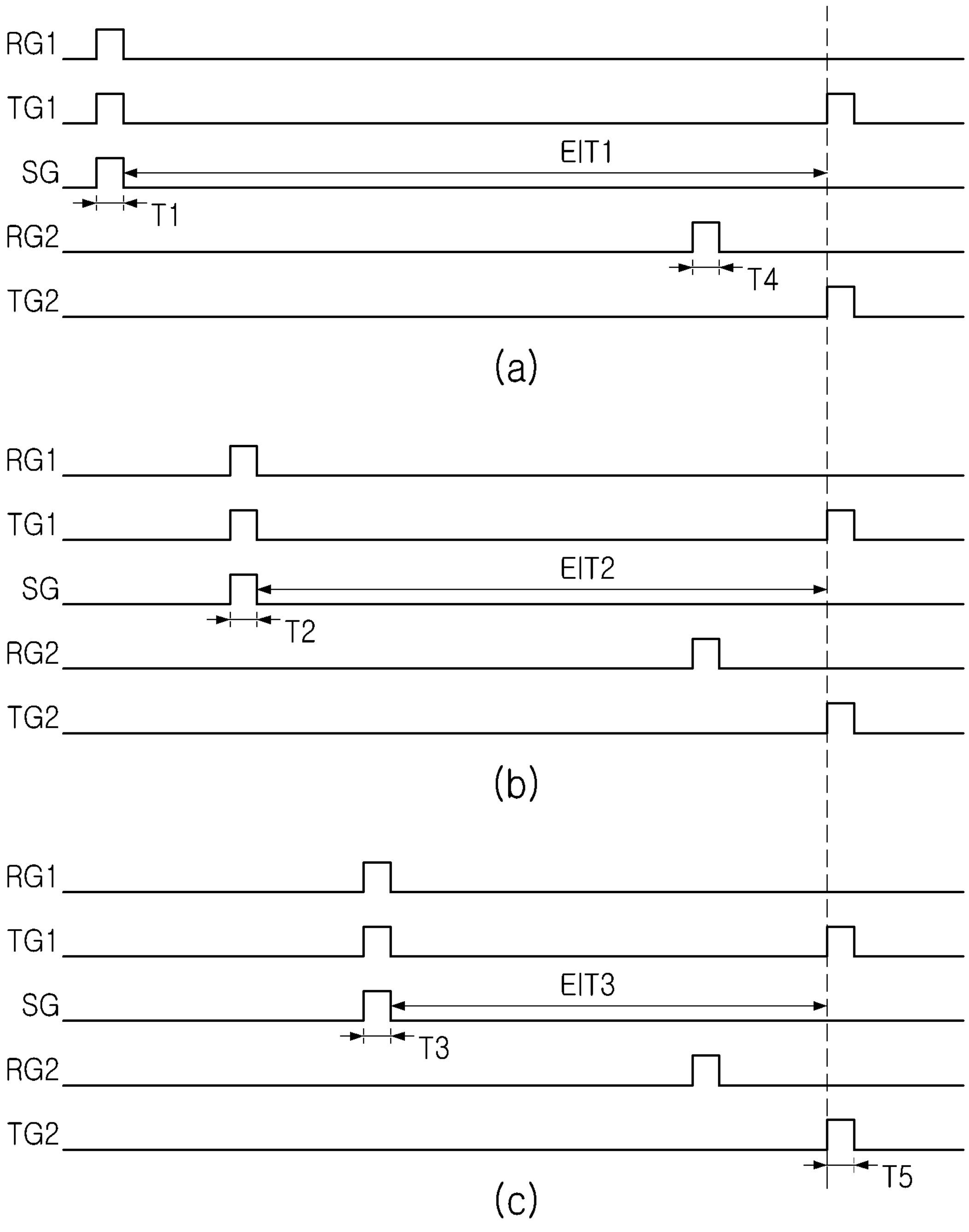

FIGS. 16 to 18 are timing diagrams illustrating operations of an image sensor according to an example embodiment of the present disclosure.

In the example embodiments described with reference to FIGS. 16 to 18, the image sensor may select the exposure time period of each pixel simultaneously driven by the row decoder to be one of the first exposure time period, the second exposure time period shorter than the first exposure time period, or the third exposure time period shorter than the second exposure time period. In each of FIGS. 16 to 18, the timing diagram (a) may indicate an operation of the first pixel configured to be the first exposure time period, the timing diagram (b) may indicate an operation of the second pixel configured to be the second exposure time period, and the timing diagram (c) may indicate an operation of a third pixel configured to be the third exposure time period.

First, referring to FIG. 16, during the first time period T1, the first reset transistor RX1, the first transfer transistor TX1 and the switch transistor SW in the first pixel may be turned on by the first reset control signal RG1, the first transfer control signal TG1 and the switch control signal SG. Accordingly, a reset operation in which electric charges of the photodiode PD and the first floating diffusion region FD1 are removed is executed in the first pixel, and when the first time period T1 ends, the first exposure time period EIT1 may begin.

In an example embodiment illustrated in FIG. 16, the first reset transistor RX1, the first transfer transistor TX1 and the switch transistor SW may be turned on in each of the second pixel and the third pixel during the first time period T1. Accordingly, during the first time period T1, the photodiode PD and the first floating diffusion region FD1 may be reset in each of the second pixel and the third pixel as well as the first pixel.

Referring still to FIG. 16, a reset operation of the second pixel may be executed during the second time period T2 after the first time period T1. During the second time period T2, the first reset transistor RX1, the first transfer transistor TX1 and the switch transistor SW in the second pixel may be turned on by the first reset control signal RG1, the first transfer control signal TG1 and the switch control signal SG. Accordingly, a reset operation in which electric charges of the photodiode PD and the first floating diffusion region FD1 are removed from the second pixel may be executed. When the second time period T2 ends, the second exposure time period EIT2 may begin.

In an example embodiment illustrated in FIG. 16, a reset operation may also be executed on a third pixel during the second time period T2. Accordingly, electric charges generated by the photodiode PD may be removed during a time period between the end point of the first time period T1 and a start point of the second time period T2 in each of the second pixel and the third pixel during the second time period T2.

However, during the second time period T2, the switch transistor SW of the first pixel may maintain a turned-off state. Accordingly, in the first pixel, the reset operation may not be executed even though the first reset transistor RX1 and the first transfer transistor TX1 are turned on. However, in the first pixel, at least a portion of electric charges generated by the photodiode PD may move to the first floating diffusion region FD1 by the turning-on of the first transfer transistor TX1.

Thereafter, a reset operation of the third pixel may be executed during the third time period T3 after the second time period T2. During the third time period T3, the first reset transistor RX1, the first transfer transistor TX1 and the switch transistor SW in the third pixel may be turned on by the first reset control signal RG1, the first transfer control signal TG1 and the switch control signal SG. Accordingly, a reset operation in which electric charges of the photodiode PD and the first floating diffusion region FD1 are removed may be executed in the third pixel. When the third time period T3 ends, the third exposure time period EIT3 may begin.

During the third time period T3, the switch transistor SW of the first pixel and the second pixel may maintain a turned-off state. Accordingly, in the first pixel and the second pixel, the reset operation may not be executed even though the first reset transistor RX1 and the first transfer transistor TX1 are turned on. However, a portion of electric charges of the photodiode PD in each of the first pixel and the second pixel may move to the first floating diffusion region FD1 by the turning-on of the first transfer transistor TX1.

Operations in the fourth time period T4 and the fifth time period T5 may be similar to those described above with reference to FIG. 9. For example, the second reset transistor RX2 may be turned on in each of the first to third pixels by the second reset control signal RG2 output by the row decoder during the fourth time period T4. This way, a voltage of the second floating diffusion region FD2 may be reset. The readout circuit may read the reset voltage from each of the first to third pixels after a voltage of the second floating diffusion region FD2 is reset.

In the fifth time period T5, the first transfer transistor TX1 and the second transfer transistor TX2 may be turned on in each of the first to third pixels by the first transfer control signal TG1 and the second transfer control signal TG2 output by the row decoder. Accordingly, in each of the first to third pixels, electric charges stored in the photodiode PD and the first floating diffusion region FD1 may move to the second floating diffusion region FD2. The readout circuit may read the pixel voltage from each of the first to third pixels during the fifth time period T5, and may generate a pixel signal corresponding to the difference between the reset voltage and the pixel voltage.

Referring first to FIG. 17, during the first time period T1, the first reset transistor RX1, the first transfer transistor TX1 and the switch transistor SW in the first pixel may be turned on by the first reset control signal RG1, the first transfer control signal TG1 and the switch control signal SG. Accordingly, a reset operation in which electric charges of the photodiode PD and the first floating diffusion region FD1 are removed may be executed in the first pixel, and when the first time period T1 ends, the first exposure time period EIT1 may begin.

In an example embodiment illustrated in FIG. 17, the first time period T1, the second time period T2 and the third time period T3 may start simultaneously. The second time period T2 may begin at the same time point as that of the first time period T1 and may end later than the first time period T1, and the third time period T3 may begin at the same time point as that of the first time period T1 and may end later than the second time period T2. As such, in the example embodiment illustrated in FIG. 17, by configuring the second time period T2 to be longer than the first time period T1 and configuring the third time period T3 to be longer than the second time period T2, there may be a difference between the first exposure time period EIT1, the second exposure time period EIT2 and the third exposure time period EIT3. For example, the first exposure time period EIT1 may be the longest exposure time period and the third exposure time period EIT3 may be the shortest exposure time period.

During the second time period T2, the first reset transistor RX1 and the first transfer transistor TX1 in the second pixel may be turned on twice. Accordingly, the second pixel may execute the reset operation twice during the second time period T2. During the third time period T3, the first reset transistor RX1 and the first transfer transistor TX1 in the third pixel may be turned on twice. Accordingly, the third pixel may execute three reset operations during the third time period T3.

Operations in the fourth time period T4 and the fifth time period T5 may be similar to the other example embodiments described above. During the fourth time period T4, the second reset transistor RX2 may be turned on in each of the first to third pixels, and thus, a voltage of the second floating diffusion region FD2 may be reset. The readout circuit may read the reset voltage from each of the first to third pixels after a voltage of the second floating diffusion region FD2 is reset.

In the fifth time period T5, the first transfer transistor TX1 and the second transfer transistor TX2 may be turned on in each of the first to third pixels. Accordingly, in each of the first to third pixels, electric charges stored in the photodiode PD and the first floating diffusion region FD1 may move to the second floating diffusion region FD2. The readout circuit may read the pixel voltage from each of the first to third pixels during the fifth time period T5, and thus, the readout circuit may generate a pixel signal corresponding to the difference between the reset voltage and the pixel voltage.

In an example embodiment illustrated in FIG. 18, in each of a first pixel, a second pixel, and a third pixel, in addition to the switch control signal SG, the first reset control signal RG1 and the first transfer control signal TG1 may be independently controlled. In other words, the first reset transistor RX1 and the first transfer transistor RX1 may be independently operated in all the pixels. For example, an operation according to an example embodiment illustrated in FIG. 18 may be implemented in an image sensor in which a first reset control signal RG1, a first transfer control signal TG1 and a switch control signal SG are output by a column decoder. As an example, the image sensor 300 according to an example embodiment described with reference to FIG. 4 may operate as in the example embodiment described with reference to FIG. 18.

Referring to FIG. 18, the first reset transistor RX1, the first transfer transistor TX1 and the switch transistor SW in the first pixel may be turned on by the first reset control signal RG1, the first transfer control signal TG1 and the switch control signal SG during the first time period T1, under control of the column decoder. Accordingly, a reset operation in which electric charges of the photodiode PD and the first floating diffusion region FD1 are removed may be executed in the first pixel, and when the first time period T1 ends, the first exposure time period EIT1 may start.

In an example embodiment illustrated in FIG. 18, during the first time period T1, the switch transistor SW and also the first reset transistor RX1 and the first transfer transistor TX1 may not be turned on in each of the second pixel and the third pixel. Accordingly, the reset operation may not be executed on the second pixel and the third pixel during the first time period T1.

A reset operation may be executed in the second pixel during the second time period T2 after the first time period T1. The first reset transistor RX1, the first transfer transistor TX1 and the switch transistor SW in the second pixel may be turned on by the first reset control signal RG1, the first transfer control signal TG1 and the switch control signal SG during the second time period T2. Accordingly, a reset operation in which electric charges of the photodiode PD and the first floating diffusion region FD1 are removed from the second pixel may be executed. When the second time period T2 ends, the second exposure time period EIT2 may begin.

In an example embodiment illustrated in FIG. 18, the first reset transistor RX1 and the first transfer transistor TX1 in the first pixel and the third pixel may remain in a turned-off state during the second time period T2. Accordingly, the reset operation is not executed in the first pixel and the third pixel, and electric charges generated by the photodiode PD of the first pixel may not move to the first floating diffusion region FD1 during the second time period T2.

Thereafter, during the third time period T3 after the second time period T2, a reset operation may be executed in the third pixel. During the third time period T3, the first reset transistor RX1, the first transfer transistor TX1 and the switch transistor SW in the third pixel may be turned on by the first reset control signal RG1, the first transfer control signal TG1 and the switch control signal SG. Accordingly, a reset operation in which electric charges of the photodiode PD and the first floating diffusion region FD1 are removed may be executed in the third pixel. When the third time period T3 ends, the third exposure time period EIT3 may begin.

During the third time period T3, the first reset transistor RX1, the first transfer transistor TX1, and the switch transistor SW may maintain a turned-off state in each of the first pixel and the second pixel. Accordingly, the reset operation may not be executed on the first pixel and the second pixel.

Operations in the fourth time period T4 and the fifth time period T5 may be similar to the other example embodiments described above. During the fourth time period T4, the second reset transistor RX2 may be turned on in each of the first to third pixels by the second reset control signal RG2 output by the row decoder. Therefore, a voltage of the second floating diffusion region FD2 may be reset. The readout circuit may read the reset voltage from each of the first to third pixels after the voltage of the second floating diffusion region FD2 is reset.

In the fifth time period T5, the first transfer transistor TX1 may be turned on in each of the first to third pixels by the first transfer control signal TG1 output by the column decoder, and the second transfer transistor TX2 may be turned on in each of the first to third pixels by the second transfer control signal TG2 output by the row decoder. Accordingly, in each of the first to third pixels, electric charges stored in the photodiode PD and the first floating diffusion region FD1 may move to the second floating diffusion region FD2. The readout circuit may read the pixel voltage from each of the first to third pixels during the fifth time period T5, and thus, the readout circuit generate a pixel signal corresponding to the difference between the reset voltage and the pixel voltage.

As such, in various example embodiments, at least two reset operations may be executed for each pixel. For example, a first reset operation of removing electric charges of the photodiode PD and the first floating diffusion region FD1 may be executed preferentially by turning on the first reset transistor RX1 and the first transfer transistor TX1 and the switch transistor SW in each pixel. Thereafter, a second reset operation of removing electric charges of the second floating diffusion region FD2 may be performed by turning on the second reset transistor RX2 while the first reset transistor RX1, the first transfer transistor TX1 and the switch transistor SW are turned off. The readout circuit may read the reset voltage after the second reset operation.

The exposure time period of each pixel may be a time from an end point of a first reset operation to a time point at which both the first transfer transistor TX1 and the second transfer transistor TX2 are turned on. By individually controlling the switch transistor SW of each of the selected pixels arranged in the row direction using a column decoder, the exposure time periods of at least a portion of the selected pixels may be configured differently. By individually configuring the optimal exposure time period for each pixel by referring to the image data of the previous frame or the preview page, an image sensor, which may provide a HDR function in a single frame and may have a relatively high dynamic range, may be implemented.

Figure 19:
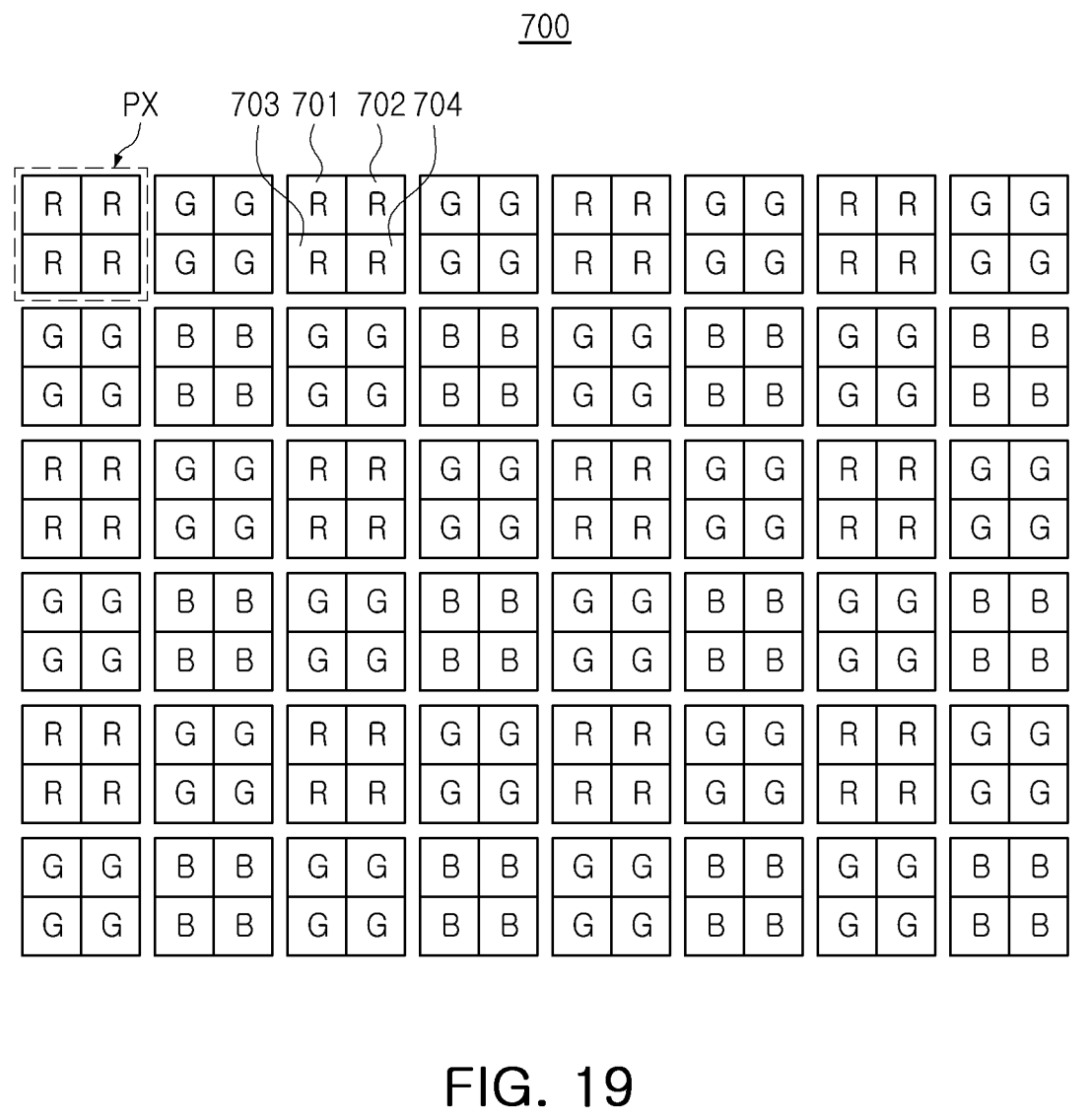

FIG. 19 is a diagram illustrating a pixel array of an image sensor according to an example embodiment of the present disclosure.

Referring to FIG. 19, a pixel array 700 of an image sensor according to an example embodiment may include a plurality of pixels PX arranged in a first direction (the horizontal direction) and a second direction (the vertical direction). Each of the plurality of pixels PX may include two or more sub-pixels 701, 702, 703 and 704 disposed adjacent to each other. In an example embodiment illustrated in FIG. 19, each of the plurality of pixels PX may include four sub-pixels 701 to 704 arranged in a 2×2 shape, but an example embodiment thereof is not limited thereto. For example, the arrangement shape or the number of the sub-pixels 701 to 704 included in each of the plurality of pixels PX may vary in example embodiments.

The sub-pixels 701 to 704 included in each plurality of pixels PX may share a color filter of the same color. In an example embodiment, the sub-pixels 701 to 704 included in each of the plurality of pixels PX may include one of a red color filter, a green color filter, and a blue color filter in common.

In each of the plurality of pixels PX, each of the sub-pixels 701 to 704 may include a photodiode and a first transfer transistor. In addition, in each of the plurality of pixels PX, the sub-pixels may share devices other than the first transfer transistor among devices included in the pixel circuit, which will be described in greater detail with reference to FIG. 20.

Figure 20:
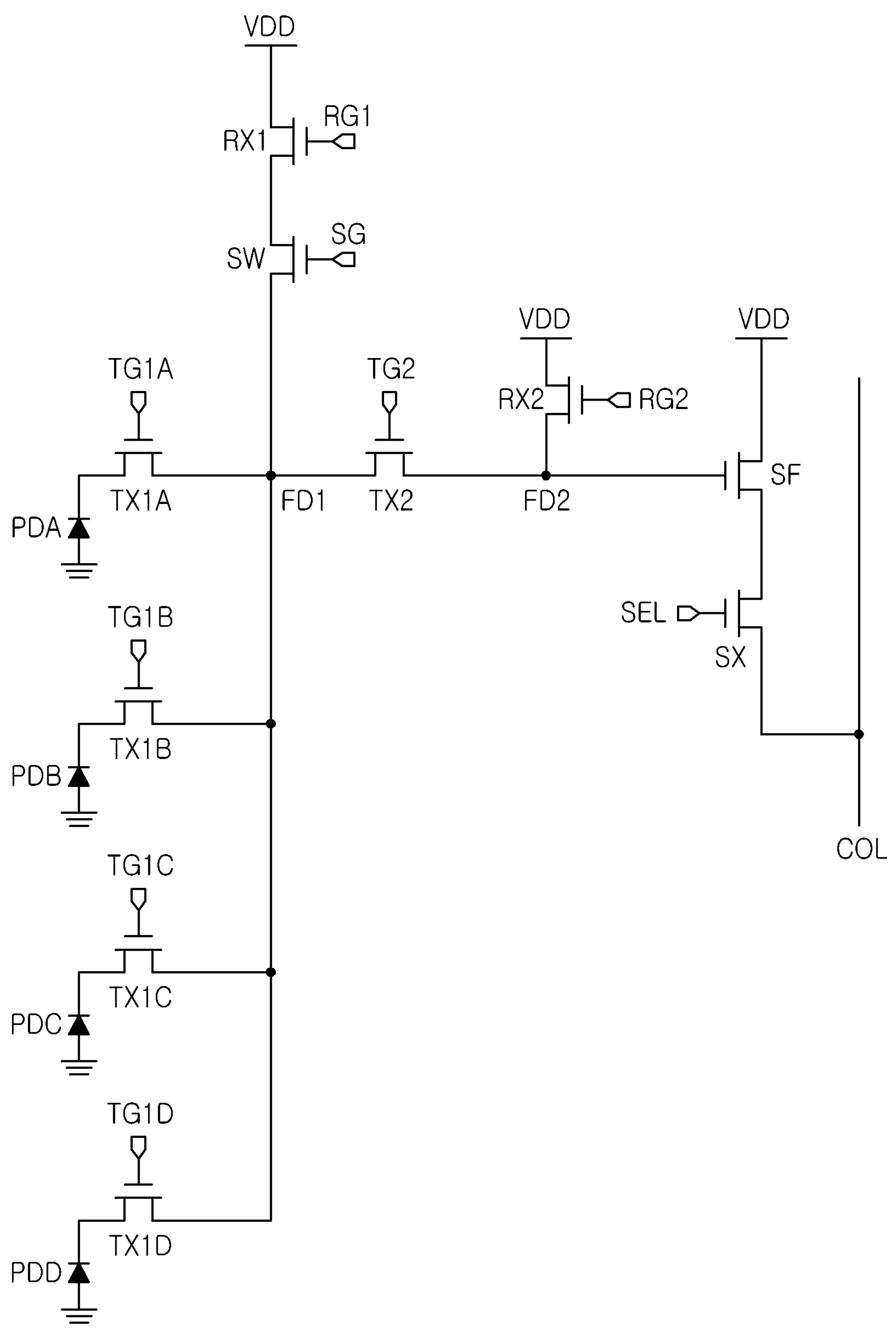
FIG. 20 is a circuit diagram illustrating pixels included in an image sensor according to an example embodiment of the present disclosure.
Figure 21:
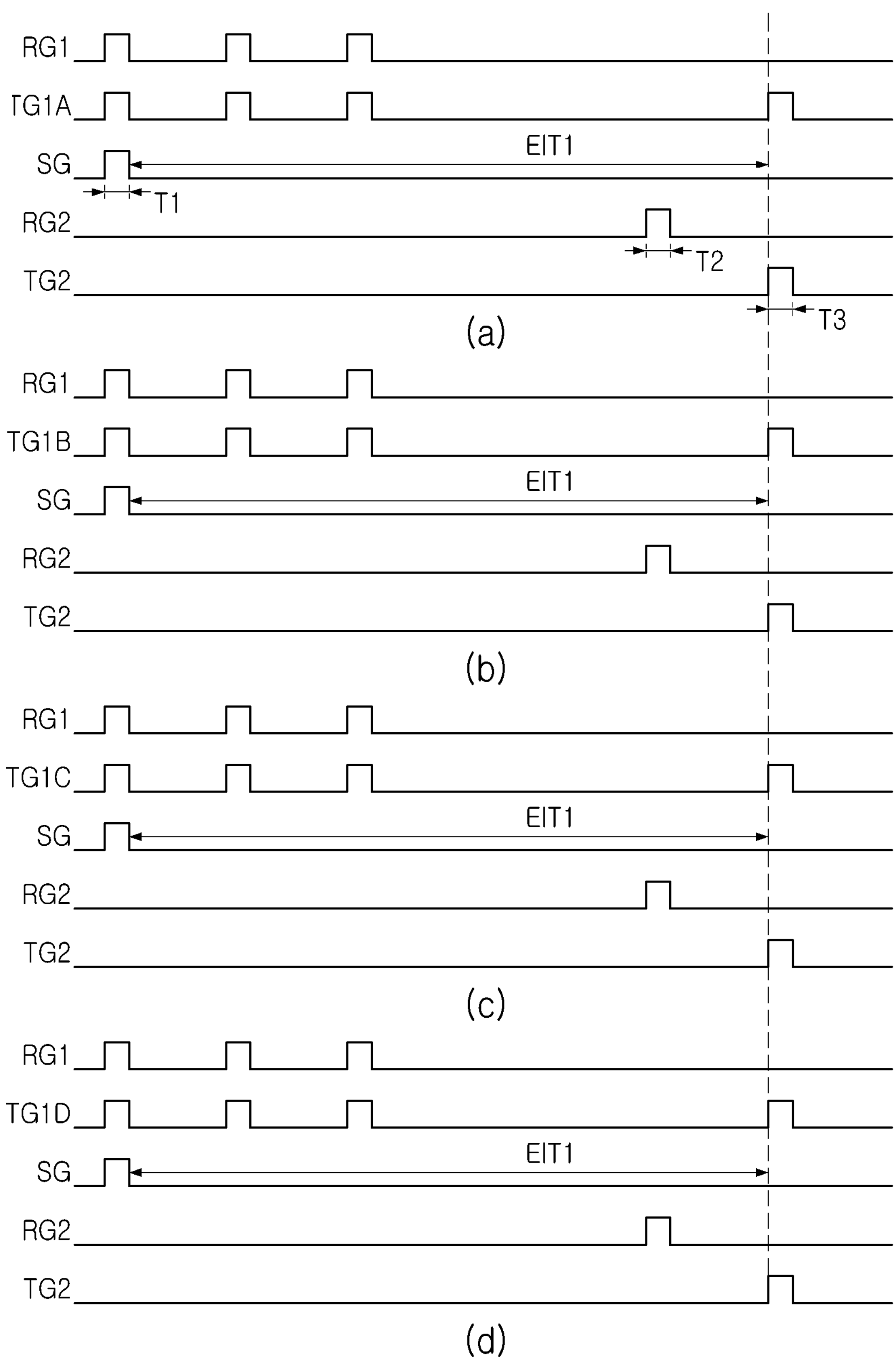
FIG. 21 is a timing diagram illustrating operations of an image sensor according to an example embodiment of the present disclosure.

FIG. 20 is a circuit diagram illustrating pixels included in an image sensor according to an example embodiment of the present disclosure. FIG. 21 is a timing diagram illustrating operations of an image sensor according to an example embodiment of the present disclosure.

Referring to FIG. 20, a pixel of an image sensor according to an example embodiment may include a plurality of photodiodes PDA, PDB, PDC and PDD, and a pixel circuit configured to output a voltage signal corresponding to electric charges generated by the plurality of photodiodes PDA-PDD. A pixel circuit may connect the plurality of photodiodes PDA-PDD to an output line COL.

The pixel circuit may include a plurality of first transfer transistors TX1A, TX1B, TX1C and TX1D, a second transfer transistor TX2, a first reset transistor RX1, a second reset transistor RX2, a switch transistor SW, a source-follower transistor SF, and a select transistor SX. A pixel in the example embodiment illustrated in FIG. 20 may include a plurality of sub-pixels as in the example embodiment previously described with reference to FIG. 19.

For example, the first sub-pixel may include a first photodiode PDA and a first transfer transistor TX1A, and the second sub-pixel may include a second photodiode PDB and a first transfer transistor TX1B. The third sub-pixel may include a third photodiode PDC and a first transfer transistor TX1C, and the fourth sub-pixel may include a fourth photodiode PDD and a first transfer transistor TX1D.

The plurality of sub-pixels included in a pixel may share the second transfer transistor TX2, the first reset transistor RX1, the second reset transistor RX2, the switch transistor SW, the source-follower transistor SF and the select transistor SX. As described above with reference to FIG. 2, a first floating diffusion FD1 may be configured as a node between the plurality of first transfer transistors TX1A-TX1D and the second transfer transistor TX2, and a second floating diffusion FD2 may be configured as a node to which a gate of the source-follower transistor SF is connected.

In a pixel, electric charges generated by each of the plurality of photodiodes PDA-PDD may be converted into pixel signals in sequence by a pixel circuit. For example, while the first transfer transistor TX1A is turned on and the pixel signal corresponding to electric charges of the first photodiode PDA is output to the output line COL, the other first transfer transistors TX1B-TX1D may be turned off. When a pixel signal corresponding to electric charges of the first photodiode PDA is output to the output line COL, the first floating diffusion FD1 may be reset and a pixel signal corresponding to electric charges of the second photodiode PDB may be output to the output line COL.

FIG. 21 may be a diagram illustrating an operation of a pixel according to an example embodiment illustrated in FIG. 20. In a pixel according to an example embodiment illustrated in FIG. 20, operations as in timing diagrams (a) to (d) illustrated in FIG. 21 may be executed sequence.

In an example embodiment, as illustrated in timing diagram (a), during the first time period T1, the first reset transistor RX1, the first transfer transistor TX1A, and the switch transistor SW may be turned on and the first floating diffusion FD1 and the first photodiode PDA may be reset. Thereafter, the first exposure time period EIT1 may begin, the second reset transistor RX2 may be turned on and the second floating diffusion FD2 may be reset during the second time period T2, and a reset voltage may be output to an output line COL. During the third time period T3, the first transfer transistor TX1 and the second transfer transistor TX2 may be turned on, and a pixel voltage corresponding to electric charges generated during the first exposure time period EIT1 in the first photodiode PDA may be output to the output line COL.

When the operation according to timing diagram (a) is completed, operations according to timing diagrams (b) to (d) may be executed in sequence. Accordingly, the same exposure time period may be applied to each of the plurality of sub-pixels included in a single pixel.

However, similar to the example embodiments described above, at least one of the devices of the pixel circuit, for example, a switch transistor SW, may be controlled by a column decoder, differently from other devices, e.g., the first reset transistor RX1, the first transfer transistor TX1A, etc., controlled by a row decoder. Accordingly, the exposure time periods of a portion of the pixels commonly receiving the control signal output by the row decoder, for example, selected pixels arranged in the first direction, may be controlled differently.

In an example embodiment, the first exposure time period of the first pixel and the second exposure time period of the second pixel may be configured differently by differently controlling operation of the switch transistor SW in each of the first pixel and the second pixel among the selected pixels. In other words, the exposure time for the first pixel and the second pixel can be individually set by varying the control of the switch transistor SW in each pixel, allowing for different exposure times for the first and second pixels. For example, during the first exposure time period EIT1 after the first time period T1 when the first photodiode PDA is reset in the first pixel, the column decoder may maintain the switch transistor SW of the first pixel to be in a turned-off state and may turn the switch transistor SW of the second pixel on.

Accordingly, the first photodiode PDA and the first floating diffusion FD1 may be reset only in the second pixel, and the exposure time period of the second pixel may be configured to be shorter than the first exposure time period EIT1 of the first pixel.

Figure 22:
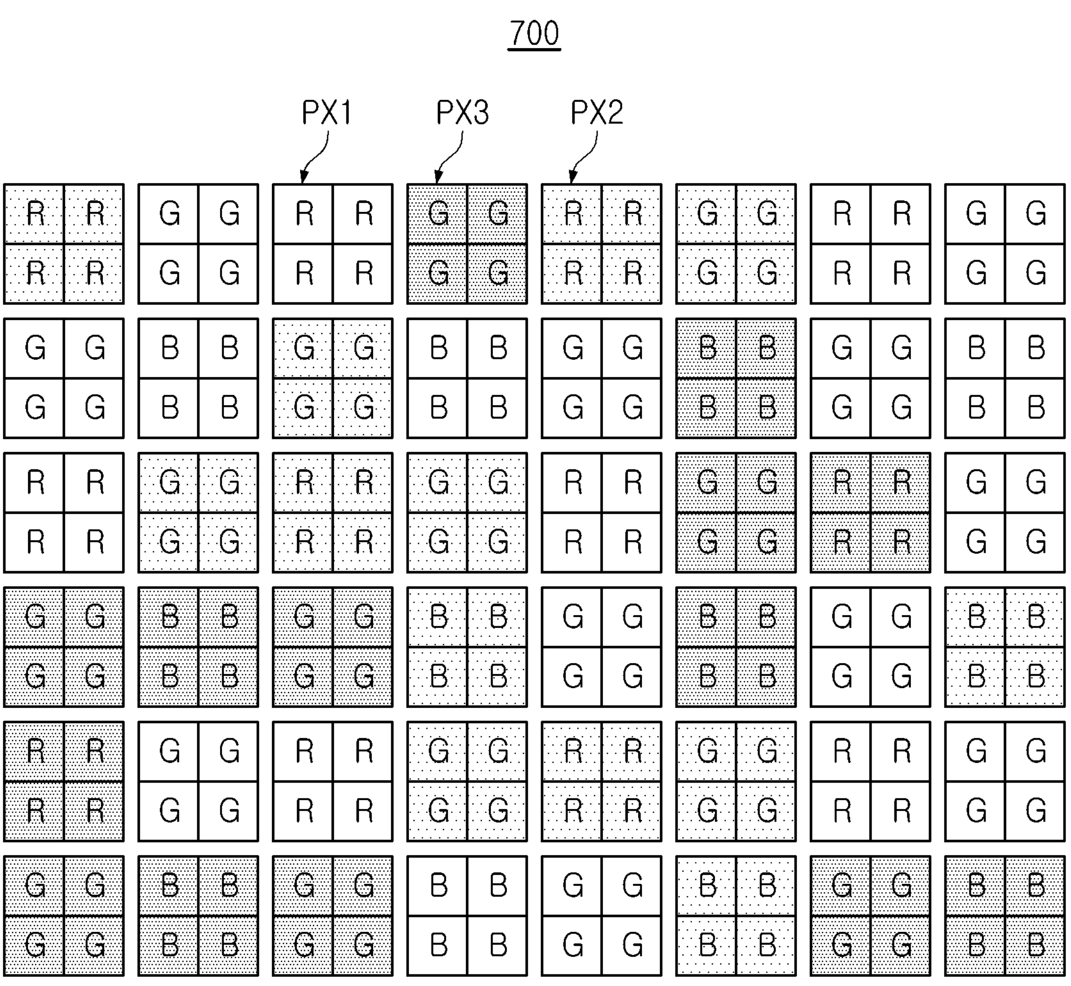
FIG. 22 is a diagram illustrating operations of an image sensor according to an example embodiment of the present disclosure.

FIG. 22 is a diagram illustrating operations of an image sensor according to an example embodiment of the present disclosure.

FIG. 22 may be a diagram illustrating an operation of individually configuring an exposure time period for each pixel in an image sensor. In an example embodiment illustrated in FIG. 22, the image sensor 700 may configure each pixel to be one of a first pixel PX1, a second pixel PX2 and a third pixel PX3. The first exposure time period of the first pixel PX1 may be longer than the second exposure time period of the second pixel PX2 and the third exposure time period of the third pixel PX3. The second exposure time period of the second pixel PX2 may be longer than the third exposure time period of the third pixel PX3. In other words, the first pixel PX1 may have the longest exposure time period and the third pixel PX3 may have the shortest exposure time period.

In an example embodiment illustrated in FIG. 22, each of the pixels of the image sensor 700 may include a plurality of sub-pixels, and the exposure time periods of the sub-pixels included in each of the plurality of pixels may be the same. The exposure time period of each pixel may be configured individually by resetting each pixel to a different time point. The readout operation of reading the reset voltage and the pixel voltage from each pixel may be executed simultaneously in the pixels disposed in the same row, and accordingly, the image sensor may implement an HDR function within only a single frame.

Figure 23:
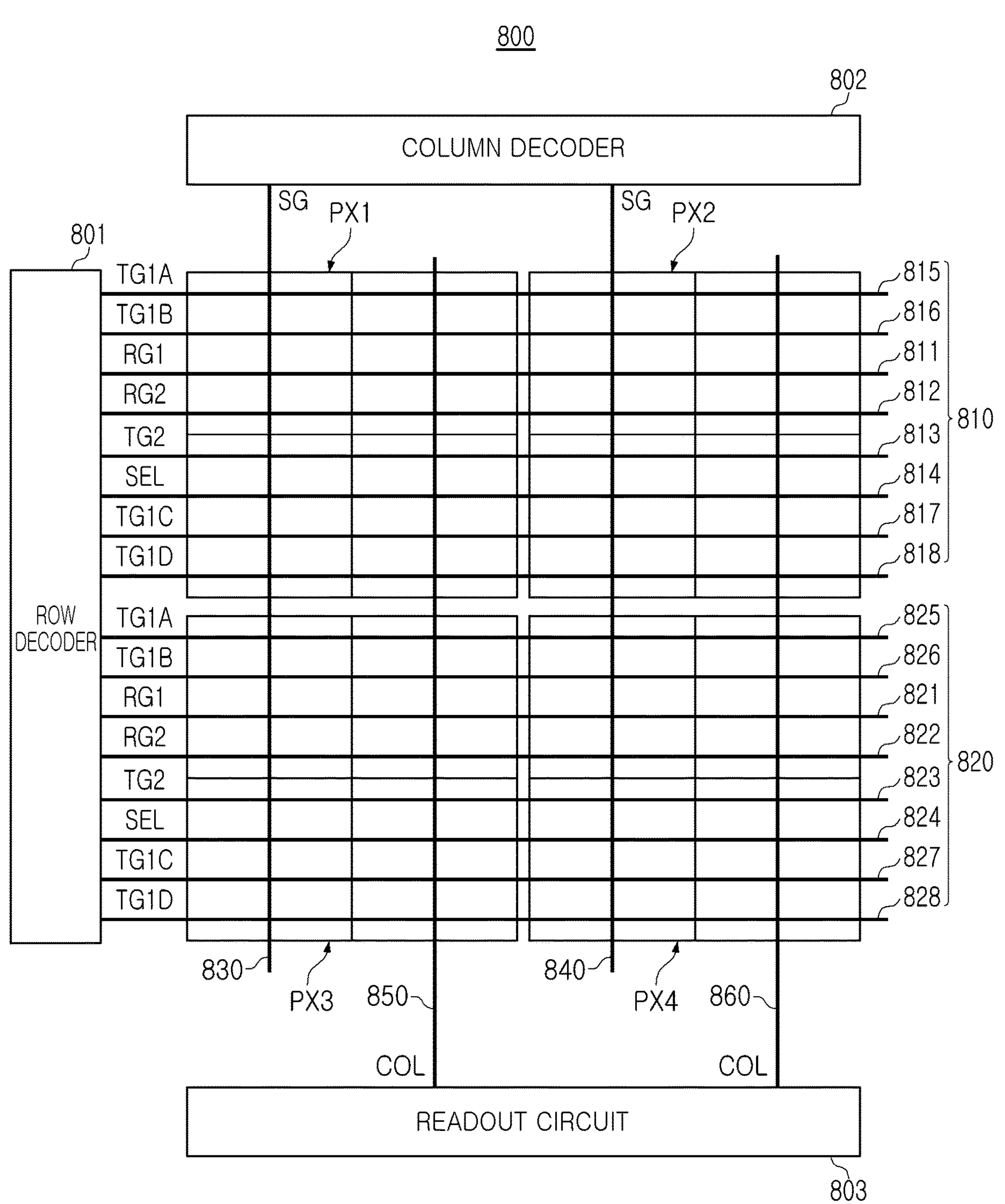
FIG. 23 is a diagram illustrating an image sensor according to an example embodiment of the present disclosure.

FIG. 23 is a diagram illustrating an image sensor according to an example embodiment of the present disclosure.

Referring to FIG. 23, an image sensor 800 may include a plurality of pixels PX1-PX4, a row decoder 801, a column decoder 802, and a readout circuit 803. The plurality of pixels PX1-PX4 may be arranged in a first direction (the horizontal direction) and a second direction (the vertical direction). Each of the plurality of pixels PX1 to PX4 may have a structure as described above with reference to FIGS. 19 and 20.

The row decoder 801 may be connected to the plurality of pixels PX1-PX4 through a plurality of row control lines 810 (811, 812, 813, 814, 815, 816, 817, 818) and 820 (821, 822, 823, 824, 825, 826, 827, 828), and the column decoder 802 may be connected to the plurality of pixels PX1-PX4 through a plurality of column control lines 830 and 840. The readout circuit 803 may be connected to the plurality of pixels PX1-PX4 through a plurality of output lines 850 and 860.

A portion of pixels arranged in the first direction and disposed in the same position in the second direction may share the plurality of row control lines 810 and 820. For example, the first pixel PX1 and the second pixel PX2 may be commonly connected to the first row control lines 811-818 (810), and the third pixel PX3 and the fourth pixel PX4 may be commonly connected to the second row control lines 821-828 (820).

The first row control lines 810 may include a first reset control line 811, a second reset control line 812, a second transfer control line 813, a select control line 814 and a plurality of first transfer control lines 815-818. The first reset control line 811 may transfer the first reset control signal RG1, and the second reset control line 812 may transfer the second reset control signal RG2. The second transfer control line 813 may transfer the second transfer control signal TG2, the select control line 814 may transfer the select control signal SEL, and the plurality of first transfer control lines 815-818 may transfer a plurality of first transfer control signals TG1A, TG1B, TG1C and TG1D. The configuration of the second row control lines 820 may be the same as that of the first row control lines 810. For example, the second row control lines 820 may include a first reset control line 821, a second reset control line 822, a second transfer control line 823, a select control line 824 and a plurality of first transfer control lines 825-828.

A portion of pixels arranged in the second direction and disposed in the same position in the first direction may share the plurality of column control lines 830 and 840 and the plurality of output lines 850 and 860. For example, the first pixel PX1 and the third pixel PX3 may be commonly connected to the first column control line 830 and the first output line 850, and the second pixel PX2 and the fourth pixel PX4 may be commonly connected to the second column control line 840 and the second output line 860.

The column decoder 802 may output a switch control signal SG through each of the first column control line 830 and the second column control line 840. The readout circuit 803 may read a reset voltage and a pixel voltage from the plurality of pixels PX1-PX4 through the first output line 850 and the second output line 860, or may obtain a pixel signal which may be a difference between the reset voltage and the pixel voltage.

In an example embodiment, exposure time periods of the first pixel PX1 and the second pixel PX2 simultaneously selected by the row decoder 801 may be configured differently by a switch control signal SG output by the column decoder 802. For example, when the first pixel PX1 and the second pixel PX2 are determined as selected pixels, the switch transistor SW of the first pixel PX1 and the switch transistor SW of the second pixel PX2 may be turned on at different time points by the column decoder 802. As such, by separating the turned on time points of the switch transistor SW, the exposure time period of the first pixel PX1 and the exposure time period of the second pixel PX2 may be configured differently.

The order in which the readout circuit 803 reads pixel signals corresponding to electric charges of each of the plurality of photodiodes included in the sub-pixels in the first pixel PX1 may be the same as the order in which the readout circuit 803 reads the pixel signal corresponding to an electric charge of each of the plurality of photodiodes included in the sub-pixels in the second pixel PX2. For example, the first transfer transistor TX1A connected to the first photodiode PDA in each of the first pixel PX1 and the second pixel PX2 may be turned on by the first transfer control signal TG1A transmitted to the first transfer control line 815, while the other first transfer transistors TX1B-TX1D may be turned off. Accordingly, the order of obtaining pixel signals from sub-pixels of the first pixel PX1 may be the same as the order of obtaining pixel signals from sub-pixels of the second pixel PX2.

As such, in an example embodiment, the column decoder 802 may differently configure the reset time points in the selected pixels sharing the row control lines 810 and 820. Accordingly, the exposure time period of each selected pixel may be individually set, and accordingly, by configuring each of the plurality of pixels PX1-PX4 to have the optimal exposure time period, an image having a relatively high dynamic range may be created with only a single frame.

According to the aforementioned example embodiments, at least one of the devices included in the pixel circuit may be controlled by a column decoder, and the exposure time period of the first pixel and the second pixel among the selected pixels may be configured differently by configuring the reset time period of at least a portion of the selected pixels disposed on the selected row line differently. Accordingly, each individual pixel may be configured to have an optimal exposure time period suitable for a subject and shooting conditions, and the image sensor may create an image having a relatively high dynamic range by a single frame.

While the example embodiments of the present disclosure have been illustrated and described above, it will be apparent to those of ordinary skill in the art that modifications and variations may be made thereto without departing from the scope of the present disclosure as set forth by the appended claims.

What is claimed is:

1. An image sensor, comprising:

a pixel array including a plurality of pixels arranged in a first direction and a second direction intersecting the first direction; and a logic circuit including a row decoder configured to drive selected pixels disposed in the same position in the second direction among the plurality of pixels, a column decoder configured to vary exposure time periods for a portion of the selected pixels, and a readout circuit configured to obtain pixel signals from the selected pixels, wherein each of the plurality of pixels includes at least one photodiode, a first transfer transistor connected between the photodiode and a first floating diffusion region, a second transfer transistor connected between the first floating diffusion region and a second floating diffusion region, a first reset transistor and a switch transistor connected to each other in series between a power node configured to supply a power voltage and the first floating diffusion region, a second reset transistor connected between the power node and the second floating diffusion region, a source-follower transistor connected to the second floating diffusion region, and a select transistor connected to the source-follower transistor.

2. The image sensor of claim 1, wherein a capacity of the first floating diffusion region is greater than a capacity of the second floating diffusion region.

3. The image sensor of claim 1, wherein each of the plurality of pixels includes a plurality of sub-pixels, wherein each of the plurality of sub-pixels includes the photodiode and the first transfer transistor, and wherein, in each of the plurality of pixels, the plurality of sub-pixels share the second transfer transistor, the first reset transistor, the switch transistor, the second reset transistor, the source-follower transistor and the select transistor.

4. The image sensor of claim 3, wherein the selected pixels include at least one first pixel having a first exposure time period, and at least one second pixel having a second exposure time period shorter than the first exposure time period, and wherein, while the row decoder drives the selected pixels, the column decoder turns on the switch transistor of the first pixel during a first time period and turns on the switch transistor of the second pixel during a second time period later than the first time period.

5. The image sensor of claim 4, wherein the column decoder turns on the switch transistor of each of the first pixel and the second pixel during the first time period, and turns off the switch transistor of the first pixel and turns on the switch transistor of the second pixel during the second time period.

6. The image sensor of claim 4, wherein the column decoder turns on the switch transistor of the first pixel and turns off the switch transistor of the second pixel during the first time period, and turns off the switch transistor of the first pixel and turns on the switch transistor of the second pixel during the second time period.

7. The image sensor of claim 4, wherein the selected pixels further include at least one third pixel having a third exposure time period shorter than the second exposure time period, and wherein, while the row decoder drives the selected pixels, the column decoder turns on the switch transistor of the third pixel during a third time period later than the second time period.

8. The image sensor of claim 7, wherein the column decoder turns on the switch transistor of each of the first pixel, the second pixel and the third pixel during the first time period, wherein the column decoder turns off the switch transistor of the first pixel and turns on the switch transistor of each of the second pixel and the third pixel during the second time period, and wherein the column decoder turns off the switch transistor of each of the first pixel and the second pixel and turns on the switch transistor of the third pixel during the third time period.

9. The image sensor of claim 7, wherein the column decoder turns on the switch transistor of the first pixel and turns off the switch transistor of each of the second pixel and the third pixel during the first time period, wherein the column decoder turns on the switch transistor of the second pixel and turns off the switch transistor of each of the first pixel and the third pixel during the second time period, and wherein the column decoder turns on the switch transistor of the third pixel and turns off the switch transistor of each of the first pixel and the second pixel during the third time period.

10. The image sensor of claim 1, wherein the readout circuit obtains a reset voltage from each of the selected pixels during a time period in which the second reset transistor is turned on, and obtains a pixel voltage during a time period in which the second transfer transistor is turned on.

11. The image sensor of claim 10, wherein the second transfer transistor is turned on together with the first transfer transistor.

12. The image sensor of claim 1, wherein an exposure time period of each of the selected pixels is a time from a last time point at which the switch transistor transitions from a turned-on state to a turned-off state to a time point at which the second transfer transistor transitions from the turned-off state to the turned-on state.

13. An image sensor, comprising:

a pixel array that includes a plurality of pixels; and a logic circuit configured to control the pixel array, wherein each of the plurality of pixels includes at least one photodiode, a first transfer transistor directly connected to the photodiode, a second transfer transistor connected to the first transfer transistor, a switch transistor connected to a node between the first transfer transistor and the second transfer transistor, a first reset transistor connected between a power node configured to supply a power voltage and the switch transistor, a source-follower transistor having a gate connected to the second transfer transistor, a second reset transistor connected between the gate of the source-follower transistor and the power node, and a select transistor connected between the source-follower transistor and an output line, and wherein, in a read operation for each of the plurality of pixels, the logic circuit turns on the first reset transistor and the first transfer transistor in two or more reset time periods, and obtains a pixel signal in a readout time period in which the first transfer transistor and the second transfer transistor are turned on.

14. The image sensor of claim 13, wherein the logic circuit turns on the second reset transistor between the latest reset time period among the reset time periods and the readout time period.

* * * * *